United States Patent [19]

Shikata et al.

[11] Patent Number: 5,309,371
[45] Date of Patent: May 3, 1994

[54] METHOD OF AND APPARATUS FOR DESIGNING CIRCUIT BLOCK LAYOUT IN INTEGRATED CIRCUIT

[75] Inventors: Hiromi Shikata, Chiba; Yoshito Muraishi, Ichihara; Shoichi Moriya; Naoyasu Seki, both of Chiba, all of Japan

[73] Assignee: Kawasaki Steel Corporation, Hyogo, Japan

[21] Appl. No.: 543,549

[22] Filed: Jun. 26, 1990

[30] Foreign Application Priority Data

Jun. 28, 1989 [JP] Japan .................. 1-165789
Sep. 29, 1989 [JP] Japan .................. 1-254798
Oct. 6, 1989 [JP] Japan .................. 1-261731

[51] Int. Cl.$^5$ .............................. G06F 15/60
[52] U.S. Cl. .................. 364/491; 364/490; 364/489; 364/488
[58] Field of Search ............... 364/488, 489, 490, 491

[56] References Cited

U.S. PATENT DOCUMENTS

| | | | |
|---|---|---|---|
| 4,500,963 | 2/1985 | Smith et al. | 364/491 |
| 4,593,362 | 6/1986 | Bergeron et al. | 364/488 |
| 4,613,940 | 9/1986 | Shenton et al. | 364/490 |
| 4,615,011 | 9/1986 | Linsker | 364/491 |
| 4,630,219 | 12/1986 | DiGiacomo et al. | 364/488 |
| 4,754,408 | 6/1988 | Carpenter et al. | 364/491 |
| 4,805,113 | 2/1989 | Ishii et al. | 364/491 |
| 4,858,143 | 8/1989 | Fourier | 364/491 |
| 4,908,772 | 3/1990 | Chi | 364/491 |
| 4,918,614 | 4/1990 | Madarres et al. | 364/490 |
| 5,046,017 | 9/1991 | Yuyama et al. | 364/491 |

FOREIGN PATENT DOCUMENTS 63-153851  6/1988  Japan .
63-181348  7/1988  Japan .

OTHER PUBLICATIONS

"Partitioning and Placement Technique for CMOS Gate Arrays" by Odawara et al., IEEE Trans. on Computer-Aided-Design, CAD-6, No. 3, May 1987, pp. 355-363.
"Compaction Based Custom LSI Layout Design Method" by Ishikawa et al., IEEE ICCAD-85, Nov. 18-Nov. 21, 1985, pp. 343-345.
"A Block Interconnection Algorithm for Hierarchical Layout System" by Fukui et al., IEEE Trans. Computer-Aided Design, vol. CAD 6, No. 3, May 1987, pp. 383-390.
"An Algorithm to Eliminate All Complex Triangles in a Maximal Planar Graph for Use in VLSI Floor-Plan" by Tsukiyama et al., IEEE ISCC, May 5-7, 1986, pp. 321-324.

(List continued on next page.)

*Primary Examiner*—Vincent N. Trans
*Attorney, Agent, or Firm*—Oliff & Berridge

[57] ABSTRACT

There are provided a method of and an apparatus for designing a circuit block layout in an integrated circuit wherein minimization of a total wiring length among the circuit blocks and compaction of the circuit blocks are automatically achieved upon automatically laying out the circuit blocks and determining wiring among those circuit blocks, by initially laying out the circuit blocks using a spring model of a mass point system where circuit blocks with no size are coupled through springs, configuring at least partial circuit blocks as circles to re-lay out the circuit blocks such that there is eliminated any overlapping among the circuit blocks, compacting the external shape of an assembly of the circuit blocks by matching the external shape with the frame of a die and altering the shape of each circuit block from the circle to an actual shape.

17 Claims, 24 Drawing Sheets

OTHER PUBLICATIONS

"A Block Placement Procedure Using a Force Model", Hidetoshi Onodera and Keikichi Tamaru, *Papers Journal of Japan Electronics and Information Communication Society* vol. J 72-A No. 1 pp. 105-113, Jan. 1989.

*Nikkei Electronics*, Jul. 28, 1986, (No. 400) pp. 289-298, "CAD System With Fully Automatic Layout of Standard Cell LSI".

"Step by Step Placement Strategies for Building Block Layout", 1989 IEEE International Symposium on Circuits and Systems, vol. 2 of 3, pp. 921-926.

"CHAMP: Chip Floor Plan for Hierarchical VLSI Layout Design", IEEE Transactions on Computer-Aided Design, vol. CAD-4, No. 1, Jan. 1985, pp. 12-22.

"ALSO: A System for Chip Floorplan Design", Integration, The VLSI Journal, Jul. 1988, No. 2, pp. 127-146.

"A Forced Directed Component Placement Procedure for Printed Circuit Boards", IEEE Transactions on Circuit and Systems, vol. CAS-26, No. 6, Jun. 1979, pp. 377-388.

"Data in the Meeting for the Research of the Design Automation in the Society of Information Transaction", 18-3, Sep. 1983.

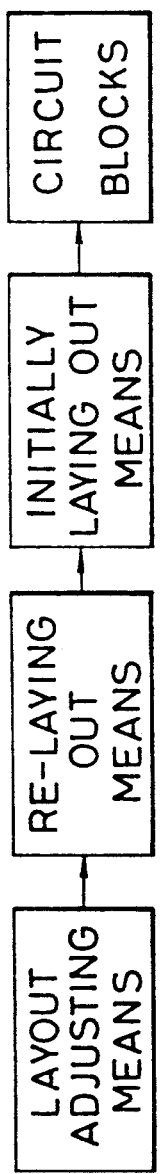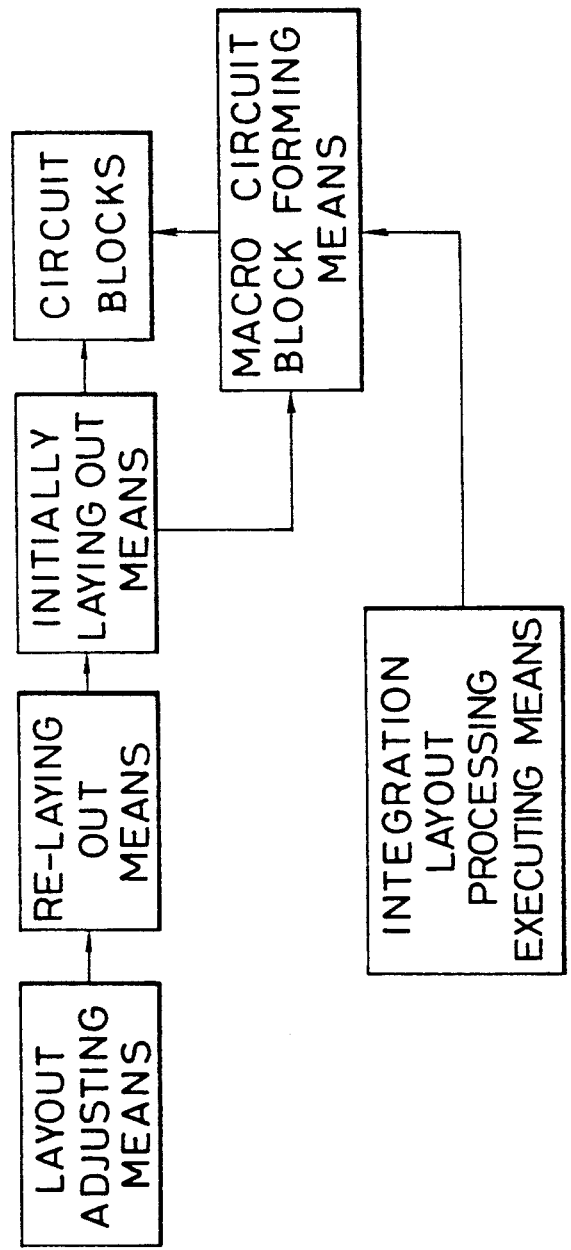

FIG. 3
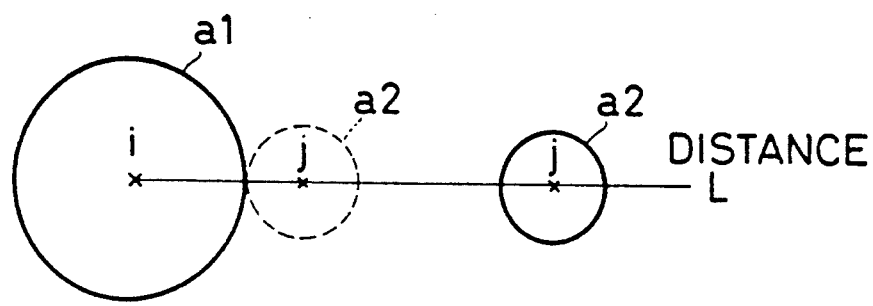
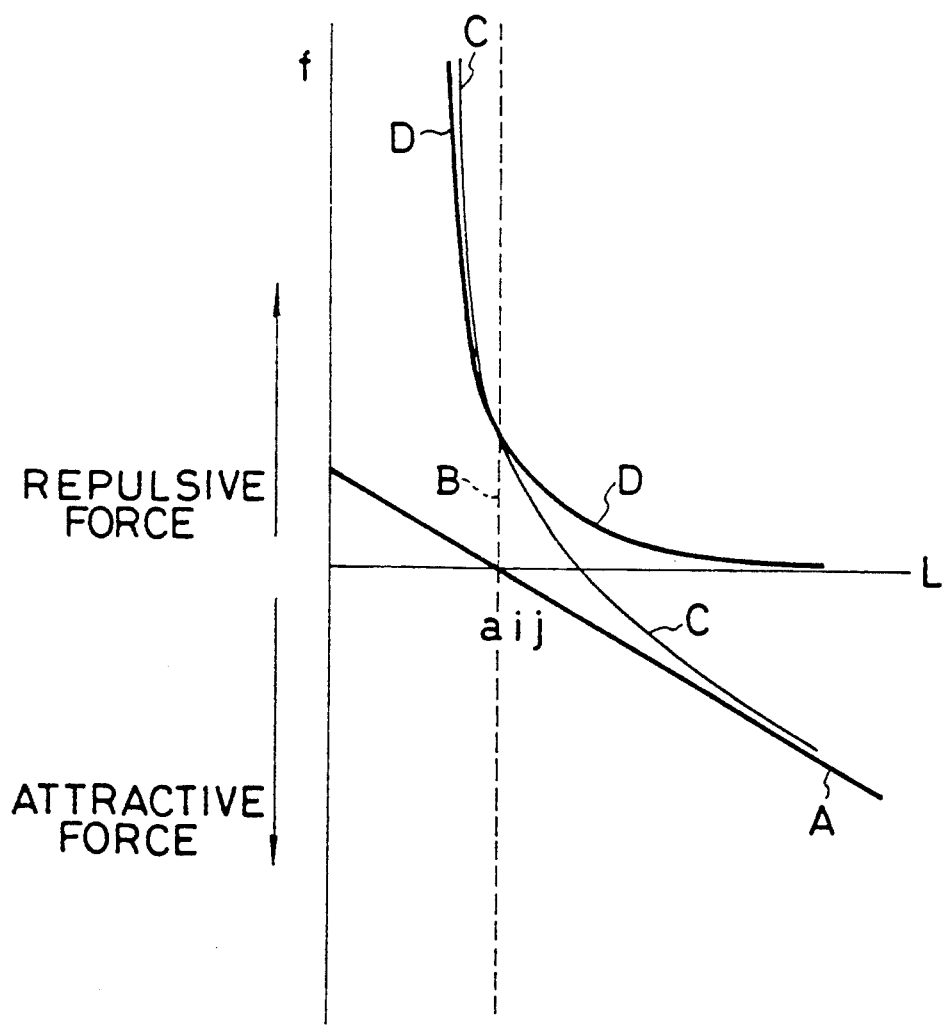

F I G. 32
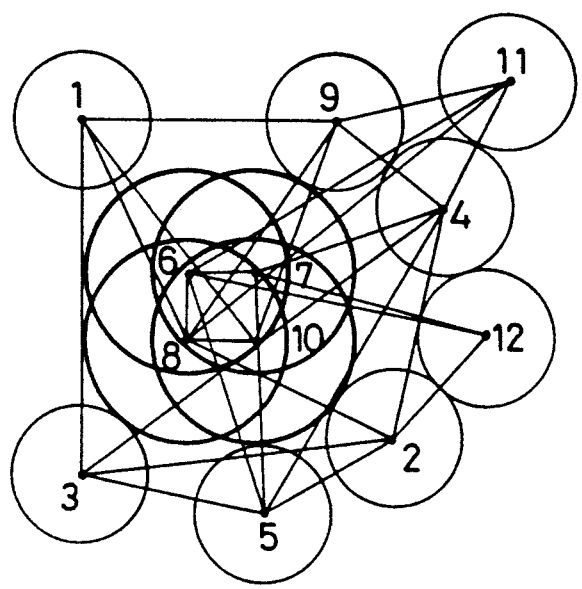
F I G. 33
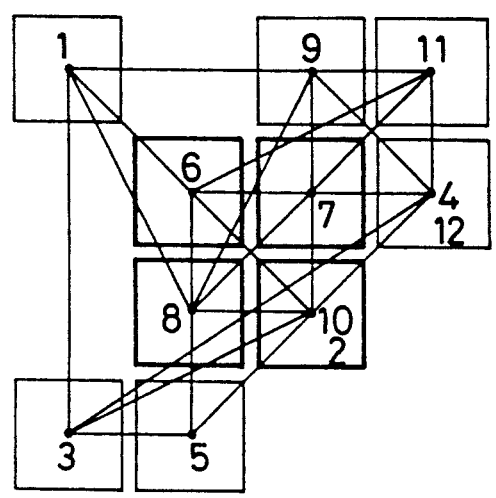
F I G. 34
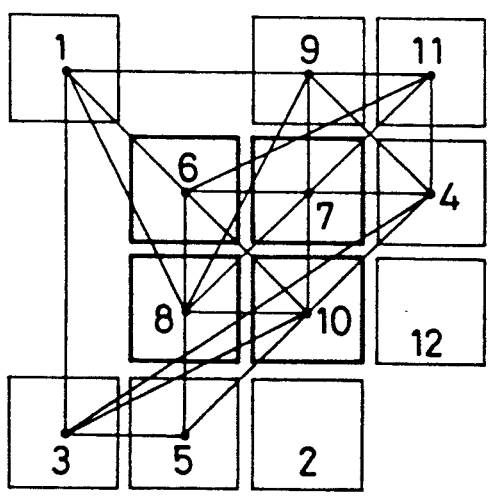
F I G. 35
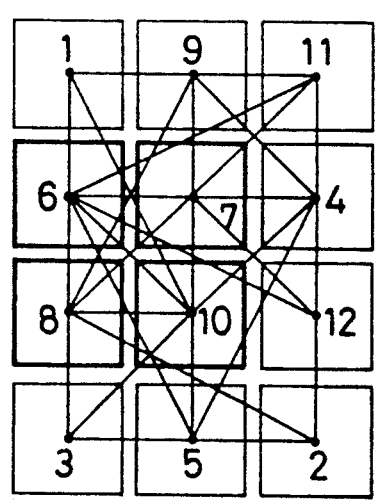

F I G. 36B
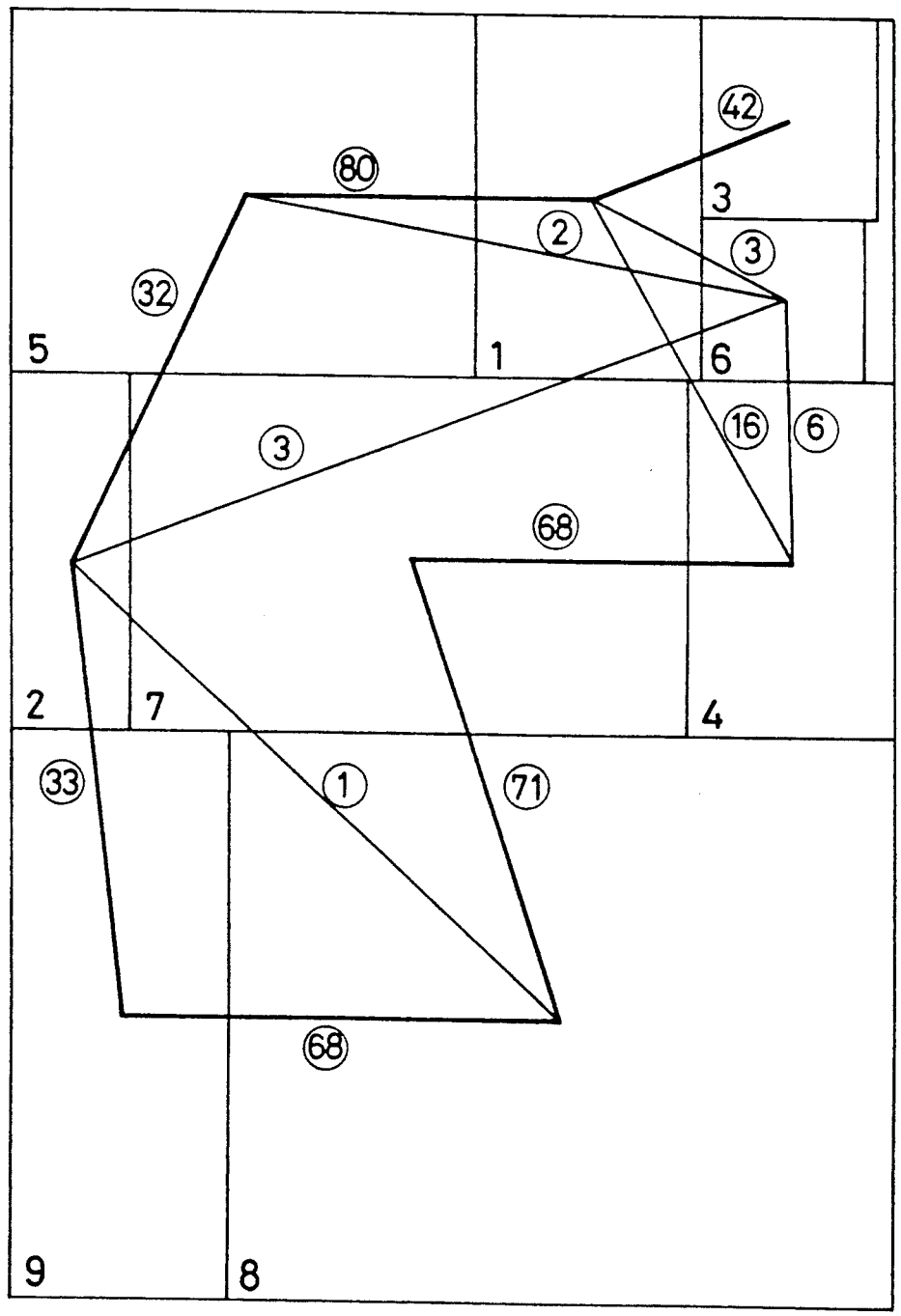

METHOD OF AND APPARATUS FOR DESIGNING CIRCUIT BLOCK LAYOUT IN INTEGRATED CIRCUIT

BACKGROUND OF THE INVENTION

1. Field of the Invention

The present invention relates to a method of and an apparatus for designing a circuit block layout in an integrated circuit, and more specifically to a method and an apparatus that are preferable for designing a floor plan in an SOG (Sea of Gate) and a macro cell layout as well as for designing a circuit block layout in a PLD (Programmable Logic Device) by use of a CAD (Computer Aided Design) apparatus, and further that are capable of designing in a short time the layout of circuit blocks such that they have a minimum total wiring length.

2. Description of the Prior Art

There is known an SOG as a large scale integrated circuit (LSI) being capable of laying out and wiring macro cells in an arbitrary region in a chip and having high flexibility on a design. For determination of such laying-out and wiring of each macro cell, it is necessary to lay out macro cells of given sizes and shapes in frames of a die having predetermined size of about four kinds (die size or chip size) for example such that the wiring distance between adjacent macro cells is minimized. In order to reduce the delay time of signal transmission and a wiring area, it is desirable to minimize the wiring distance between adjacent macro cells, and for SOGs having the same function it is desirable to also reduce the die size or chip size to the utmost.

For this purpose, there is known a hierarchical design method in which an integrated circuit is divided into functional areas in the unit of a large macro cell and wired without arranging small transistors in the circuit from the first, and then those small transistors are placed in each functional group and wired.

Also in the hierarchical design method, however, it is necessary to lay out macro cells each having a predetermined size and shape in a chip of a given size so as to minimize the wiring length between adjacent macro cells. This is a kind of problem of cutting small plates out of a large plate and there are infinite number of combinations of layouts. Prior practice to adjust the layout and shape of each macro cell therefore uses a dialogue graphic screen of a development tool for a CAD apparatus to perform the adjustment manually in trial and error, requiring time-consuming work.

For such a development tool, there is known for example an LSI layout designing device according to the hierarchy layout system disclosed for example in Japanese Laid-Open Patent Publication No. 63-181348, the device comprising a layout specification memory section, rough layout determining means, a rough layout information memory section, block layout determining means, a block layout information memory section, chip layout determining means, chip layout information memory section, and mask pattern synthesizing means.

Additionally, for designing the layout of a very large scale integrated circuit (VLSI) according to the hierarchy designing system, there is proposed a technique disclosed in for example "Data in the Meeting for the Research of the Design Automation in the society of Information Transaction, 18-3, September 1983", in which a chip floor plan is semiautomatically performed of the layout of a circuit block level, a first stage of the layout. In this technique, an initial layout of a circuit block is performed by an attractive and repulsive force method (AR method) with use of a spring model of a mass point system where the circuit blocks of an infinitesimal size are coupled through springs. In succession block packing processing is applied to the initial layout in which circuit blocks are provided with rectangles to correspond to an actual shape and the circuit blocks are moved manually in trial and error to eliminate any overlapping between adjacent circuit blocks, and the circuit blocks separated from each other are brought into close contact. In the latter half of the processing, aspect ratios of variable-shape circuit blocks are also altered manually to eliminate any overlapping among the circuit blocks. Additionally, there are calculated regions required for wirings among the circuit blocks on the basis of wiring information among the circuit blocks and of positional information of those circuit blocks.

Alternatively, there is proposed a circuit block layout technique in the Journal of the Society of Electronic Information Communication 89/I, Vol. J 72-A, No. 1, in which there is adopted a force directed method in which there are exerted on the circuit blocks attractive force corresponding to the number of wirings and repulsive force corresponding to the area of overlapping. In the circuit block layout technique, the circuit blocks 1 through 17 are rendered to the initial layout in a frame of a die 20 only with the aid of the attractive force by the wirings so as to minimize the square-sum of wiring lengths, as illustrated in FIG. 37. In succession, for the initial layout the repulsive force is gradually increased with an initial value 1/100 times the attractive force and the overlapping is gradually removed by repeated calculation such that the ratio of an overlapping area to the total area of the circuit blocks is 8.2% or less. Hereby, a relative positional relation among the circuit blocks 1 to 17 is substantially defined, as illustrated in FIG. 38. Further, orientations of the circuit blocks are examined in succession from those located distantly from the center of the layout region 20, as illustrated in FIG. 39. Finally, balanced positions of the circuit blocks are defined and the orientations of the circuit blocks are rechecked to determine the layout of the blocks, as illustrated in FIG. 40.

Herein, in the foregoing technique, slight overlapping is left behind corresponding to a fraction to balance the attractive force by the wirings. There is therefore proposed a modified technique to establish a layout without overlapping, as illustrated in FIG. 41, by expanding the circuit blocks by a slight length prior to the layout, gradually eliminating any overlapping existent among the circuit blocks until a maximum overlapping length among the circuit blocks is less than the amount of the expansion, and further returning those circuit blocks to original sizes.

In the aforementioned techniques, however, all circuit blocks are processed as rectangles and hence are not easy in movement thereof. Additionally, in the latter technique, each circuit block is not adjusted in its aspect ratio (vertical to lateral length ratio). Accordingly, there are occasions where a compact layout is not necessarily achieved as a whole provided particularly use is made of variable-shape circuit blocks such as soft macros that are variable in their aspect ratios. Further, in the aforementioned techniques circuit block positions are moved in the die frame 20 to eliminate any overlapping among the circuit blocks which was produced in the initial layout. Accordingly, the circuit block positions may sometimes be moved in excess during a process of determination of the layout, resulting in difficulties that there might be lost the conditions of the total wiring length and any dead space being both minimum.

Further, there is known a programmable logic device (PLD) for example as an integrated circuit (IC) for which a user is free to program internal wirings thereof for realization of a desired logic operation thereof.

Such a PLD is a writable and rewritable high integrated circuit including a plurality of various logic elements, say, having such a structure, as illustrated in FIG. 42, that there are previously disposed regularly in the form of a lattice programmable logic elements (PLEs) 22 as circuit blocks each with input/output pins 21 and switching stations (SSs) including switching elements (MOSFETs, for example).

In order for a user to realize a desired logic using such a PLD, a specific switching element in a specific SS is switched on to determine proper wiring direction in the SS, and wiring paths are formed among input/output pins of PLEs that are necessary for realization of the desired logic.

For this purpose, a circuit block layout design is necessary on how those PLEs are laid out in the PLD and on how the wiring paths are formed among those PLEs through the SSs.

Now, the total wiring length in the PLD should be made minimum in order to reduce the delay time of signal transmission in the PLD. It is therefore necessary to previously design the layout of the PLEs such that the total wiring length is minimum.

Prior practices to realize such a requirement are known which is capable of automatically designing the layout of the PLEs.

One example is disclosed as a simulated annealing method in Nikkei Electronics, Jul. 28, 1986 (No. 400), P 289 and thereafter.

In the simulated annealing method, a circuit block layout design is achieved such that it is judged by the following equation whether or not pair exchange among circuit blocks should be done, and the pair exchange is continued according to the result of the judgement so as to shorten the total wiring length:

$$\exp[-(E_2-E_1)/T] \geq R \qquad (1)$$

where $E_1$ and $E_2$ are estimating functions respectively before and after the exchange, T is a parameter from 0 to $\infty$, and R is a uniformly generated random number from 0 to 1. If the equation (1) holds, the circuit blocks undergo the pair exchange, and if not so, it does not undergo such exchange.

In the simulated annealing method, however, it is judged for each circuit block on the basis of the foregoing equation whether or not the circuit blocks should undergo the pair exchange, so that there is required long time for a design until a final layout of the circuit blocks is determined. For example, a PLD with 36 circuit blocks, 4.6 hours are required for determining the layout.

Additionally, for the layout design of the PLD which has strongly coupled PLEs, it is preferable in view of the reduction of the wiring length and of the prevention of any time delay to construct macro circuit blocks of various different sizes by directly connecting the PLEs through exclusive lines without mediating the SSs. However, in the aforementioned simulated annealing method, the block layout is optimized through the pair exchange of circuit blocks each with the same or substantially the same size, e.g., rectangular ones each having different lengths only longitudinally or laterally. It is therefore difficult to automatically optimize the layout of circuit blocks of different sizes, e.g., rectangular circuit blocks of different longitudinal and lateral lengths. Furthermore, if the layout of macro circuit blocks of various sizes is performed manually in trial and error observing a dialogic graphics screen of a CAD device to reduce the wiring length, it requires much time for the design, and if the design is performed manually in trial and error, the requirement to minimize the wiring length might be lost.

SUMMARY OF THE INVENTION

In view of the drawbacks with the prior art, it is a first object of the present invention to provide a method of designing a circuit block layout in an integrated circuit, the method being preferable for designing a floor plan of an SOG and a macro cell layout and being capable of automatically achieving the minimization of the entire wiring length and the compact layout of circuit blocks as well as capable of automatically determining an aspect ratio of each circuit block to lay out different size blocks in full automation and determine the wiring.

A second object of the present invention is to provide an apparatus for designing a circuit block layout in an integrated circuit capable of designing in a short time a circuit block layout that shortens a final total wiring length in the integrated circuit.

A third object of the present invention is to provide a designing apparatus capable of reducing the total wiring length and of performing a layout design in a short time even upon forming macro circuit blocks of varieties of different sizes, each macro circuit block being comprised of a plurality of circuit blocks.

To achieve the first object, a method of designing a circuit block layout in an integrated circuit, in which the method is to automatically lay out circuit blocks and determine wirings thereamong, comprises the steps of: performing an initial layout of the circuit blocks with the aid of a spring model of a mass point system in which infinitesimal circuit blocks are coupled through springs; relaying out the circuit blocks such that at least part of the circuit blocks is configured as circles so as to eliminate any overlapping among the circuit blocks; compacting the circuit to fit the external form of the circuit to the frame of a die; altering the shape of the circuit block from the circle to an actual shape; expanding the circuit block to assign an area for wiring; and adjusting an aspect ratio of each circuit block within an allowable range.

Additionally, said circuit blocks can be configured as circles and rectangles.

In accordance with the present invention, the circuit blocks are re-laid out so as to eliminate any overlapping among the circuit blocks that have undergone the initial layout and thereupon at least partial circuit blocks (particularly, soft circuit blocks which are variable in the aspect ratio) are configured as circles. The circuit blocks can therefore be moved with ease in compaction compared with prior practice wherein all circuit blocks are configured as rectangles, thereby enabling processing time to be shortened. Additionally, any overlapping among the circuit blocks is avoided, and at the same time the circuit is made compact to match over the external shape thereof with the frame of the circuit board, thereby assuring the circuit blocks being laid out in the frame of a minimum size with which the same circuit function is realizable. The shape of the circuit block is altered from a circle to an actual one and thereafter is expanded to assign a region for wiring, so that the wiring region can automatically be assigned. Moreover, the aspect ratio of each circuit block is adjusted within an allowable range, so that any overlapping among the circuit blocks can be eliminated and any dead space can be minimized in the given frame, thereby allowing the circuit blocks to be accommodated compactly in the die frame. Furthermore, there can be automatized a series of operations such as the initial layout, the re-layout in the chip frame (compaction), the assignment of the wiring area, and the adjustment of the aspect ratio.

Stillmore, there may sometimes be possible the more effective layout provided said circuit blocks are configured as circles and rectangles.

Additionally, to achieve the second object an apparatus for designing a circuit block layout in an integrated circuit according to the present invention comprises, as shown in FIG. 1 illustrating the basic construction, means for performing the initial layout of said circuit blocks using a spring model of a mass point system with attractive force corresponding to the number of wirings among the circuit blocks, means for relaying out said circuit blocks so as to eliminate any overlapping among the circuit blocks rendered to said initial layout using a spring model with repulsive force corresponding to the overlapping among the circuit blocks, and means for adjusting and laying out the circuit blocks after re-laid out such that those circuit blocks are regularly arranged.

To achieve the third object, the apparatus for designing a circuit block layout in an integrated circuit according to the present invention further comprises, as shown in FIG. 2 illustrating the basic construction, macro circuit block forming means for forming all or part of the circuit blocks existent in the integrated circuit as a macro circuit block an assembly of a plurality of the circuit blocks, and integration layout processing executing means for integrating the circuit blocks within the same macro circuit block and executing said laying-out process using the macro circuit block.

In accordance with the apparatus for designing a circuit block layout, a layout of circuit blocks is mechanically designed with use of a spring model of mass point system as shown in FIG. 3 for example.

More specifically, first, an initial layout of the circuit blocks is determined using the attractive force balance of the spring model of the mass point system which assumes attractive force as being produced corresponding to the number of wirings among the circuit blocks. A relative positional relation among the circuit blocks is determined by the initial layout.

In the above initial layout, however, there is produced overlapping among the circuit blocks owing to the attractive force. To remove the overlapping among the circuit blocks repulsive force balancing in the spring model of the mass point system that assumes the repulsive force as being produced corresponding to the overlapping area is used.

In succession, the circuit blocks after re-laid out are adjusted in the layout thereof so as to have the original regular grid shape.

The use of such a spring model allows the circuit blocks, around which many wirings have been laid, to be arranged in close vicinity to each other, thereby assuring the minimization of the entire wiring length.

Additionally, in the present inventive apparatus, unlike the aforementioned simulated annealing method, the pair exchanges among the circuit blocks are not individually estimated and executed, but the layout of all circuit blocks is determined mechanically, and hence the time required for the layout design of the circuit blocks can greatly be reduced.

In accordance with the present inventive apparatus, as described above, there can be provided the apparatus for designing a circuit block layout capable of designing in a short time the layout of circuit blocks that more reduces the total wiring length.

Additionally, a plurality of circuit blocks, for which it have been found prior to the layout design that they should be laid out in close vicinity to each other from a reason that the degree of coupling among the circuit blocks is high or for example many wirings are formed finally among the circuit blocks, can be assembled before the layout design into macro circuit blocks which are in turn integrally arranged to execute the layout processing as described above. There is therefore no possibility of a plurality of the circuit blocks of the macro circuit block being separated away from each other during the layout process. It is thus possible to prevent the macro circuit blocks from being separated away and hence further increase the advantage that the total wiring length is shortened.

As described above, there can be provided the apparatus for designing a circuit block layout capable of more shortening the total wiring length as well as of achieving the layout design for a short time even when there are formed of macro circuit blocks of varieties of different sizes comprising a plurality of circuit blocks.

BRIEF DESCRIPTION OF THE DRAWINGS

The exact nature of this invention, as well as other objects and advantages thereof, will readily be apparent from consideration of the following specification relating to the accompanying drawings, in which like reference characters designate the same or similar parts throughout the figures thereof and wherein:

FIGS. 1 and 2 are views illustrating the basic construction of apparatuses according to the present invention;

FIG. 3 is a view of a spring model of a mass point system for use in the present invention;

FIGS. 30 through 35 are views illustrating the layout of circuit blocks that undergo layout processing by a fifth embodiment of an apparatus according to the present invention;

FIGS. 36A and 36B are examples of lay out according to the present invention and the prior art respectively;

DESCRIPTION OF THE PREFERRED EMBODIMENTS

In what follows, a first embodiment of a method according to the present invention applied to a macro cell layout in an SOG will be described with reference to the accompanying drawings.

Figure 4:
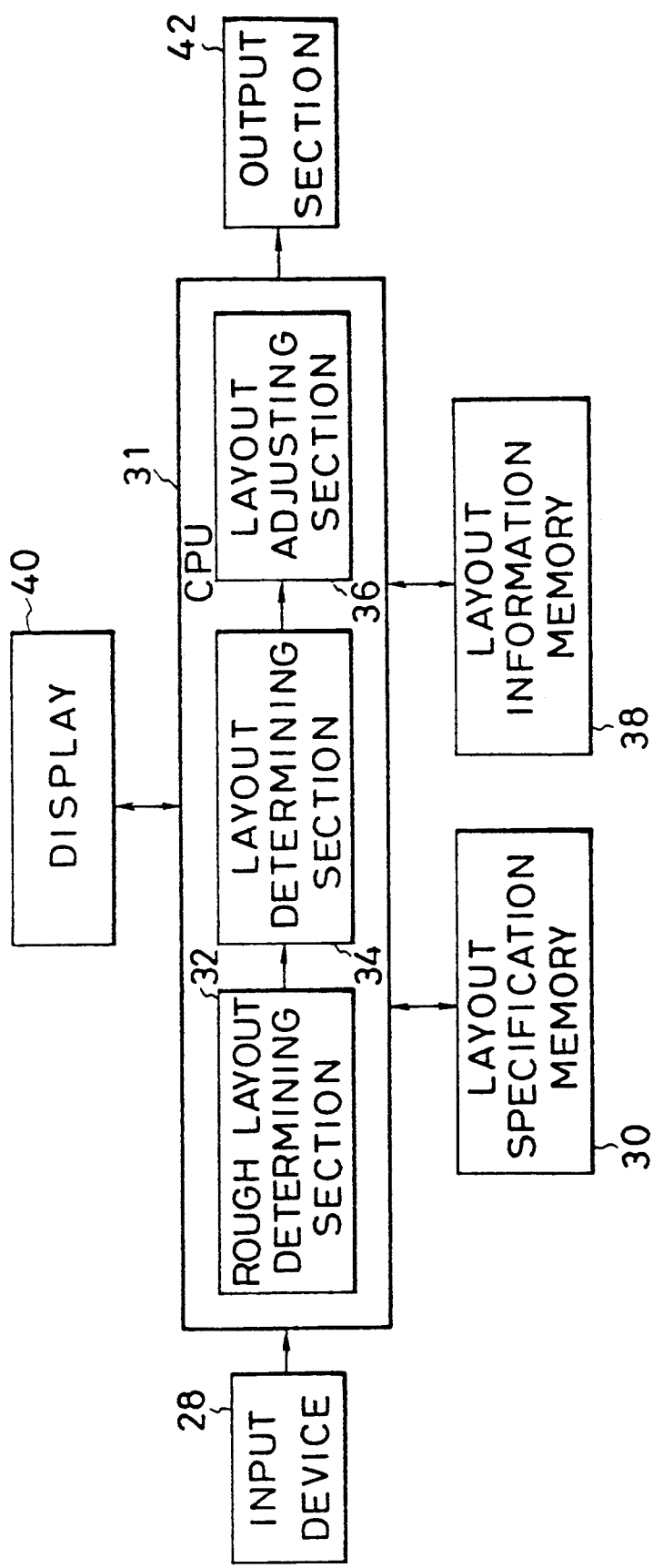
FIG. 4 is a block diagram illustrating the basic construction of an apparatus for embodying a first embodiment of the method of the present invention.

A macro cell layout and wiring apparatus for embodying the first embodiment comprises, as illustrated in FIG. 4 for example, an input device 28 for inputting necessary information into the apparatus, a layout specification memory 30 for storing therein layout specification required for determining layout and wiring of macro cells, a central processing unit (CPU) 31 for executing the processing according to the present invention, a layout information memory 38 for storing therein layout information during processing in the CPU 31, a display 40 for displaying the status of the processing in the CPU 31, and an output device 42 for outputting the layout information determined in the CPU 31.

The CPU 31 includes, as also illustrated in FIG. 4, a rough layout determining section 32 which incorporates thereinto necessary information from the foregoing layout specification memory 30, renders circuit blocks to an initial layout with use of a spring model of a mass point system in which there are coupled through springs macro cells that are ignored in their size and regarded as zero, and stores a result of the initial layout in the foregoing layout information memory 38, a layout determining section 34 which incorporates thereinto necessary information from the layout specification memory 30 and the layout information memory 38, re-lays out the circuit blocks so as to eliminate any overlapping among the circuit blocks by configuring each macro cell as a circle (corresponding to an area of the former) and taking into consideration of the size of the macro cell, gradually compacts the external shape of the circuit blocks, matching the same with a frame (four kinds for example) of a circuit board in a state of the circuit blocks where they are allowed to have any overlapping to some degree by taking into consideration a fact the aspect ratio is variable, and storing a result in the layout information memory 38, and a layout adjusting section 36 which incorporates necessary information from the layout specification memory 30 and the layout information memory 38, alters the shape of the macro cell from the circle to an actual one, and expands the macro cells to assign a wiring area, and further adjusts the aspect ratio of each macro cell within an allowable range where the total area of the macro cells remains unchanged.

Figure 5:
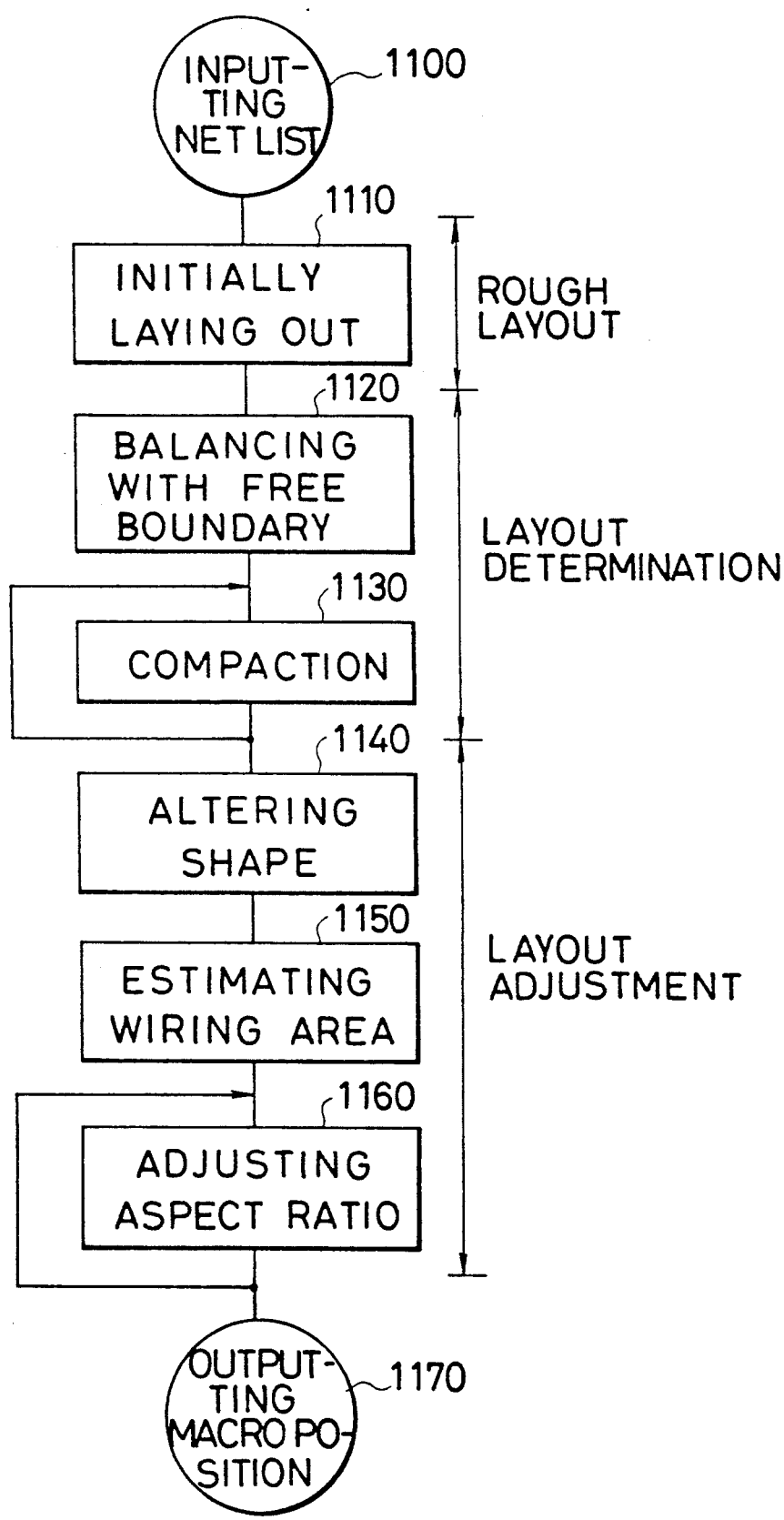
FIG. 5 is a flow chart illustrating the procedure of the first embodiment.

The macro cell layout and wiring according to the first embodiment of the present inventive method with use of the macro cell layout and wiring apparatus is executed following procedures shown in FIG. 5. Here, 12 soft macro cells are now assumed and all of them are assumed to be soft macros which have variable aspect ratios.

In step 1100, conditions such as a net list, pad conditions (fixed or free), and kinds of macros (the foregoing soft macros or hard macros with fixed aspect ratios), and the like stored in the layout specification memory 30 are first inputted into the rough layout determining means 32.

Figure 6:
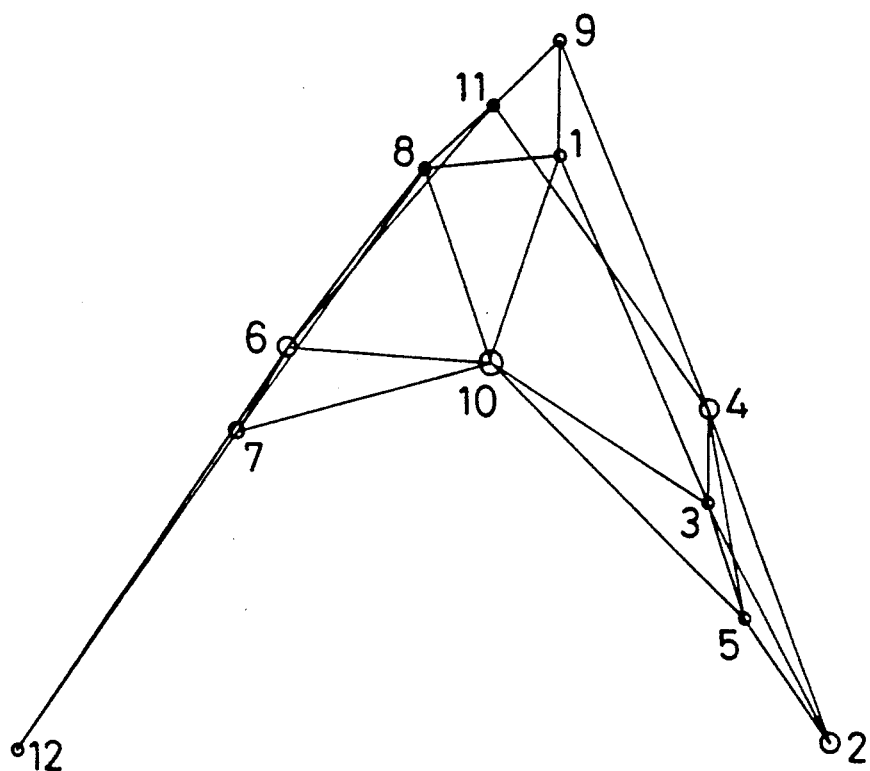
FIG. 6 is a diagram exemplarily illustrating a display screen after initial layout in the first embodiment.

In succession, in step 1110, an initial layout is established by the rough layout determining means 32, as illustrated in FIG. 6 for example, with use of the spring model of a mass point system where infinitesimal macro cells are coupled through springs. For the initial layout, in an attractive/repulsive spring model as for example illustrated in FIG. 3, there is useable a balancing equation only with attractive force indicated by the solid line A in the same figure. Herein, a free boundary is assumed as boundary conditions which means free shape of the frame.

Figure 7:
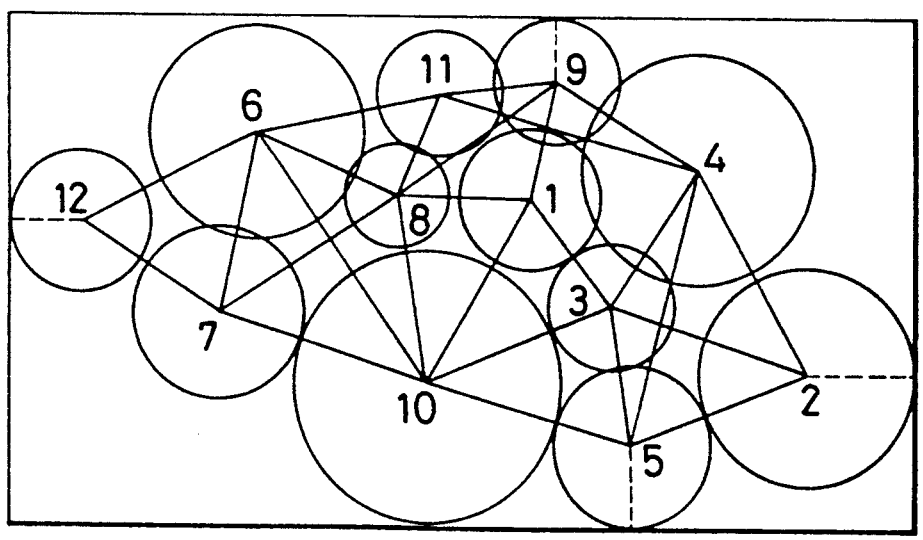
FIG. 7 is a diagram exemplarily illustrating a display screen after balancing with a free boundary in the first embodiment.

In step 1120, in succession, the layout determining means 34 re-lays out the macro cells on the basis of the initial layout determined by the rough layout determining means 32, such that any overlapping is eliminated among the macro cells with all macro cells configured as circles and with the sizes of the macro cells taken into consideration, and further balances the macro cells through the free boundary as illustrated for example in FIG. 7. For the balancing through the free boundary, there is available a balancing equation with both attractive/repulsive forces indicated by the solid line C as illustrated in FIG. 3 for example. Herein, a free boundary is assumed as the boundary conditions, too.

Figure 8:
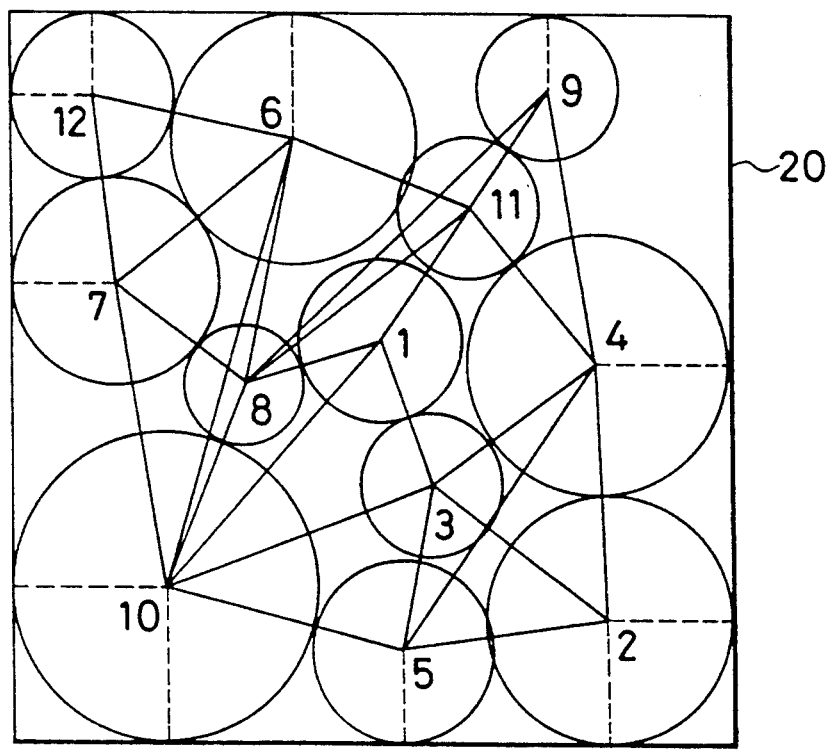
FIG. 8 is a diagram exemplarily illustrating a display screen after compaction in the first embodiment.

In step 1130, as illustrated in FIG. 8, the macro cells are gradually compacted with the external shape thereof matched with the chip size 20 (any of four kinds, for example). For the compaction, as illustrated in FIG. 3 for example, when a distance L between two macro cells i and j exceeds a contact position $a_{ij}$ therebetween, the attractive force spring model indicated by the solid line A is useable:

$$f = -c_{ij}(L - a_{ij}) \qquad \ldots (2)$$

When $L = a_{ij}$, the model is existent on the broken line B.

Further when the distance L is less than $a_{ij}$, a repulsive force spring model is useable which follows a quadratic equation indicated by the solid line D:

$$f = k_{ij} a_{ij}^2 / L^2 \qquad \ldots (3)$$

where f is attractive or repulsive force exerted between the circuit blocks, $c_{ij}$ the number of wirings between both circuit blocks, $a_{ij}$ an intercentral distance when the circuit blocks $a_1$ and $a_2$ make contact with each other or a diameter of the circuit block (when the circuit block is expressed by a circle), L an intercentral distance between both circuit blocks, and $k_{ij}$ an empirical constant.

Herein, the boundary conditions are given by a die frame.

Use of the spring model where balancing is achieved through the attractive/repulsive forces assures a compacting layout of the macro cells in a given frame without sacrificing the requirement of the minimum wiring length.

Herein, for the mechanical model upon the compaction, a spring model that utilizes attractive/repulsive force balancing as indicated by the solid line C shown in FIG. 3 is also useable to eliminate any overlapping produced owing to the attractive force spring by making use of the repulsive force balancing by cutting off the attractive force spring immediately after the foregoing overlapping is produced. Otherwise, a spring model only with use of repulsive force balancing indicated by the solid line D illustrated in FIG. 3 is also useable to eliminate any overlapping and any dead space by cutting off all attractive force springs and compacting the macro cells.

Figure 9:
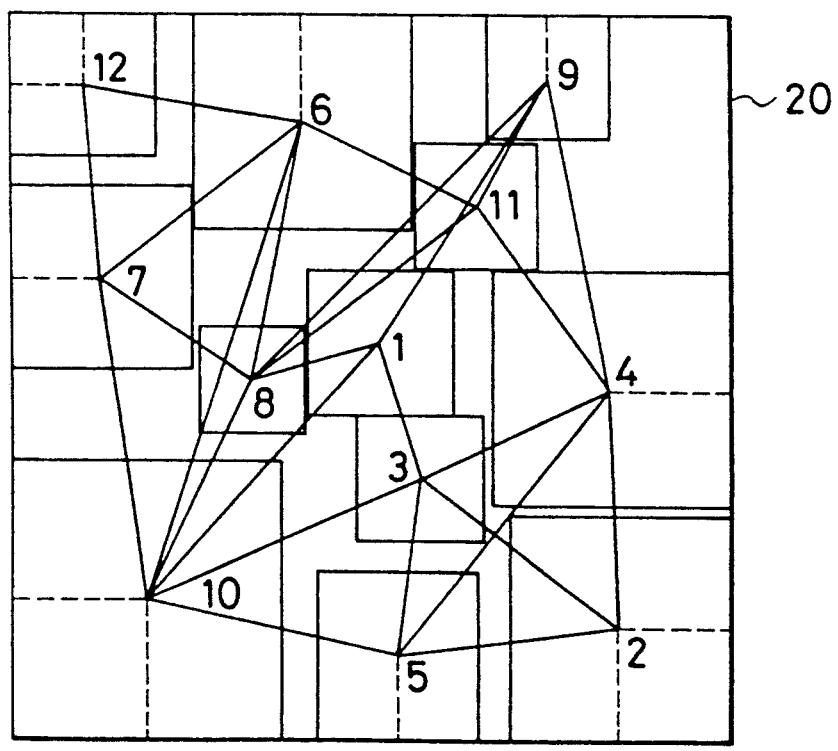
FIG. 9 is a diagram exemplarily illustrating a display screen after a shape is altered in the first embodiment.

In step 1140 after the compaction in the foregoing step 1130, the layout adjusting section 36 executes shape alteration where the shape of any macro cell is altered from the circle to an actual one (a rectangle, here) as illustrated in FIG. 9. For the shape alteration the die frame is assumed as the boundary conditions, and for the balancing equation a repulsive force spring is useable for example.

Figure 10:
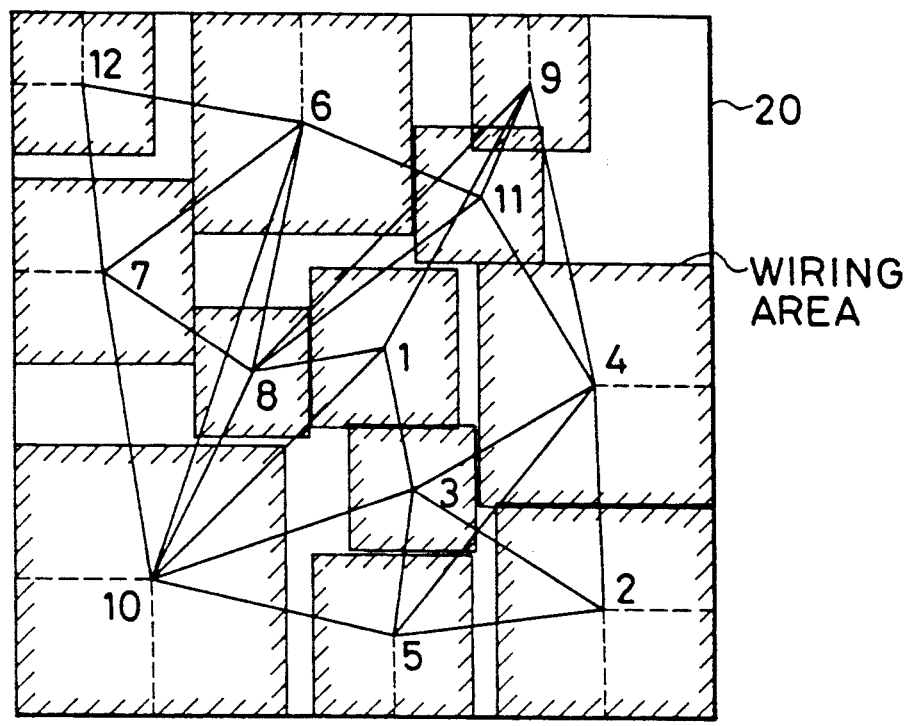
FIG. 10 is a diagram exemplarily illustrating a display screen after a wiring area is assigned in the first embodiment.

In succession, in step 1150, as illustrated in FIG. 10, the macro cells are expanded and areas for wirings (hatched areas in the figure) are assigned to the surroundings of the macro cells. Also in this situation, the die frame may be assumed as the boundary conditions and a balancing equation only with repulsive force may be used.

Figure 11:
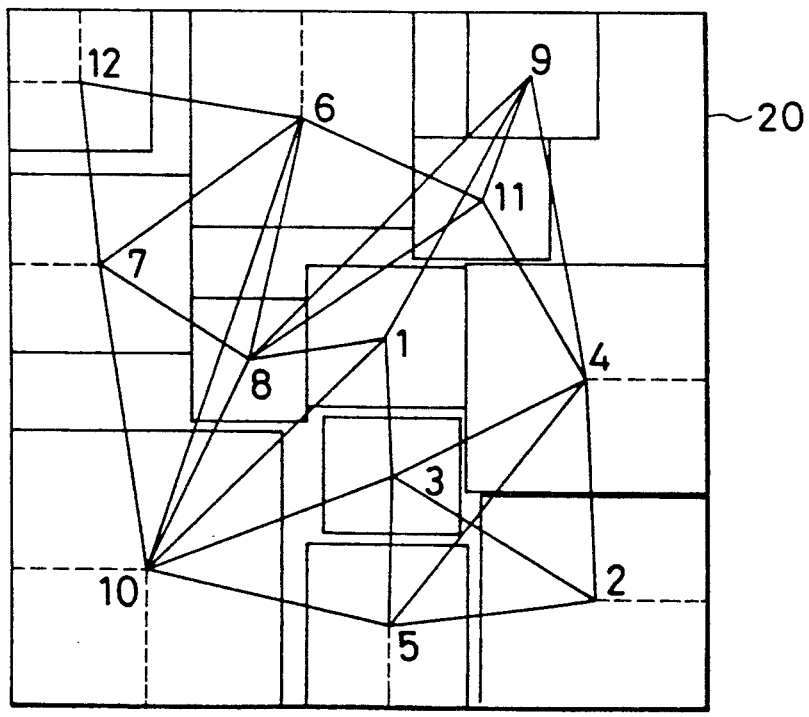
FIG. 11 is a diagram exemplarily illustrating a display screen after an aspect ratio is adjusted in the first embodiment.

In step 1160, as illustrated in FIG. 11, the aspect ratio of each macro cell (soft macro) is adjusted within the allowable range with the constant area to determine the layout. Also, herein, the die frame is assumed as the boundary conditions, and the balancing equation only with the repulsive force is useable without taking the attractive force into consideration because of the adjustment being fine. Further, if there is included any hard macro cell that is not alterable in a block shape, the aspect ratio of the hard macro is fixed except for the wiring area.

In step 1170 after the step 1160 has been completed, the output section 42 outputs the determined position of the macro cells.

In the following, a second embodiment of the present invention method will be described.

Figure 12:
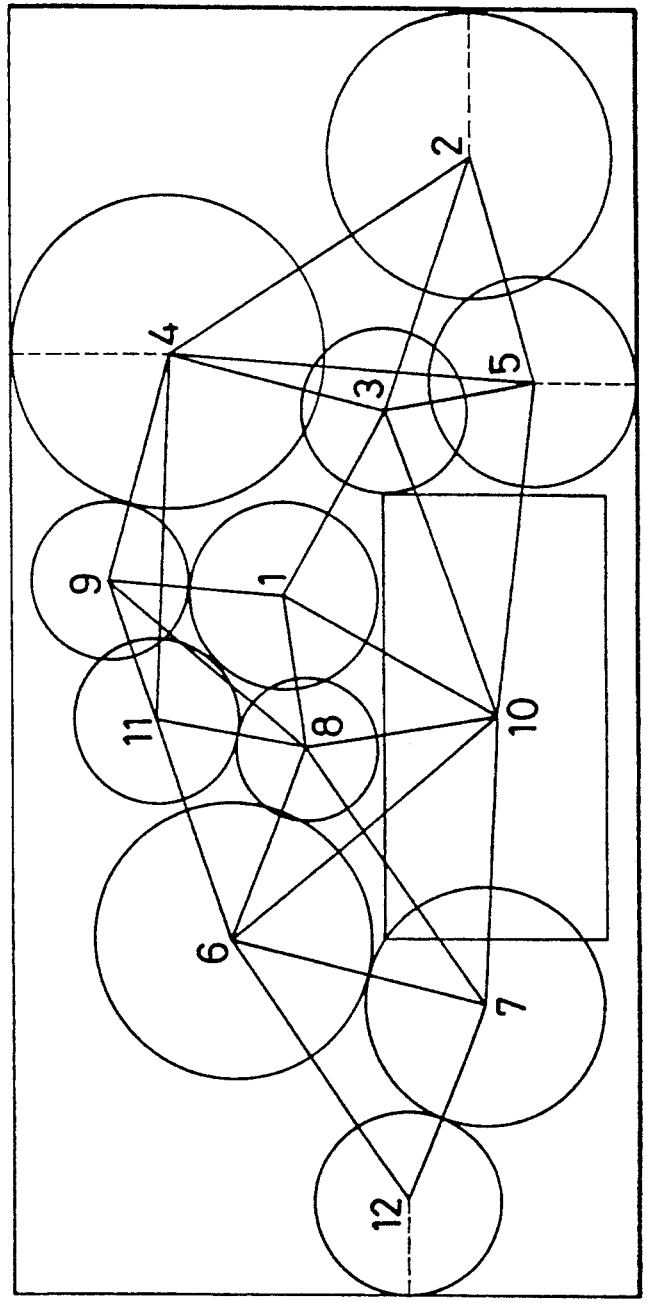
FIG. 12 is a diagram exemplarily illustrating a display screen after balancing with a free boundary in a second embodiment of the method of the present invention.
Figure 13:
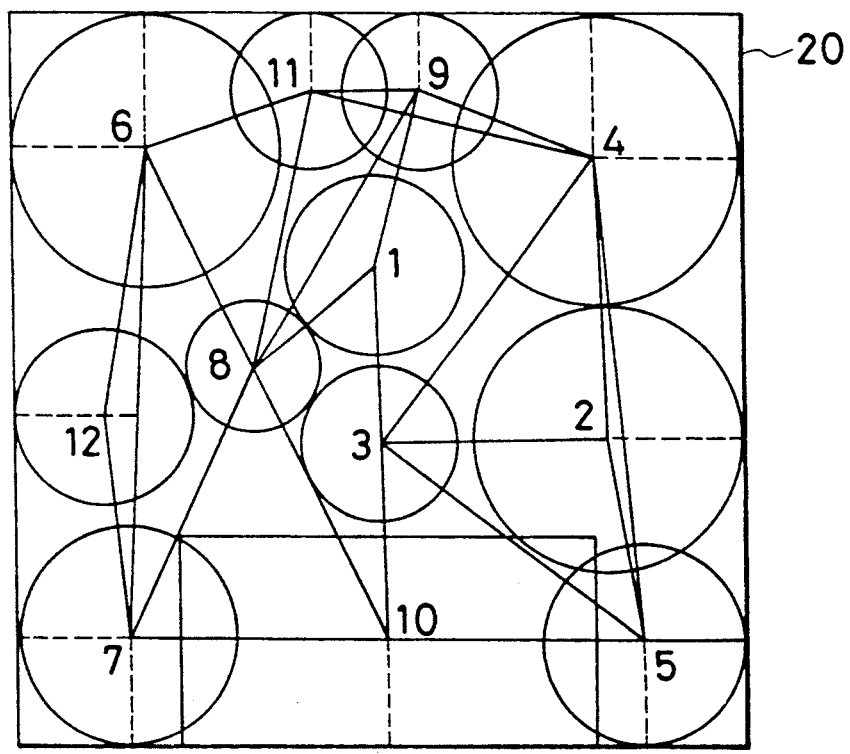
FIG. 13 is a diagram exemplarily illustrating a display screen after compaction in the second embodiment.

In the second embodiment, as shown in FIG. 12, in step 1120 in the same procedure as in the first embodiment illustrated in FIG. 5, partial macro cells (numeral 10 in the figure) each with a fixed aspect ratio are configured into a rectangle corresponding to an actual shape to balance them through a free boundary. In succession, in step 1130, the external shape is compacted, matching with the chip size 20, as illustrated in FIG. 13.

Procedures thereafter are the same as those in the first embodiment and description thereof will be omitted.

In accordance with the second embodiment, since the partial macro cells are configured as a rectangle not a circle, so that an effective layout is possible provided in particular the aspect ratio of the macro cell is fixed.

Herein, although in the foregoing embodiments the present inventive method was applied to the layout of macro cells in an SOG, it is clear the present inventive method is also applicable to general block layouts without limitation to the above situation.

In what follows, embodiments of inventive apparatuses for applying the present invention to a design of a PLD will be described.

Figure 14:
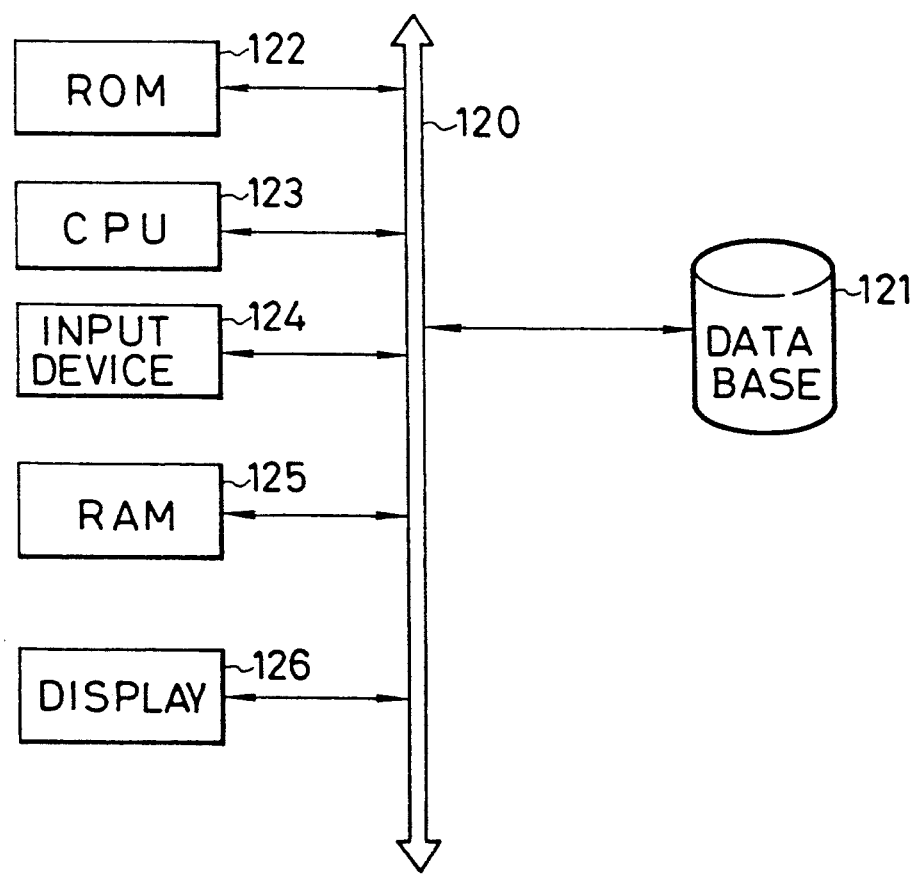
FIG. 14 is a view substantially illustrating the system construction of a third embodiment that realizes an apparatus according to the present invention.

Referring to FIG. 14, there is illustrated the simplified system construction of a third embodiment of the present invention which is to realize an apparatus for designing a circuit block layout in a PLD.

In the FIG. 14, designated at 120 is a system bus composed of a data bus and a control bus, to which there are connected a data base 121 for holding therein positional data of all circuit blocks on a PLD, a ROM 122 including a program, that controls the operation of a CPU, written therein, a central processing unit (CPU) 123 that performs arithmetic operation for determining an optimum layout of the circuit blocks upon forming the shortest wiring on the basis of net list data (wiring data among the circuit blocks), an input device 124 composed of a key board, a mouse, and the like, a RAM 125 for storing therein a calculated result from the CPU, and a display 126 such as a CRT capable of displaying on its screen the layout-designed circuit blocks even in the course of the layout processing.

In the present embodiment, a spring model such for example as illustrated in FIG. 3 may be used for designing the layout of the circuit blocks, in which it is assumed that circuit blocks are coupled through springs and attractive and repulsive forces are exerted on those circuit blocks.

The solid line A in FIG. 3 indicates attractive force balancing where attractive force is exerted according to an intercentral distance between circuit blocks $a_1$ and $a_2$. When the intercentral distance between the blocks $a_1$ and $a_2$ is $a_{ij}$, both attractive and repulsive forces are zero. The attractive force balancing model is expressed by the aforementioned equation (2). Herein, the intercentral distance $a_{ij}$ is set in the RAM.

According to the attractive force spring model indicated by the solid line A, larger attractive force is exhibited as the number of the wirings between both blocks is increased. Herein, the number of the wirings can be obtained from the net list data.

The solid line D illustrated in FIG. 3 represents a repulsive force balancing model where only repulsive force is exerted between the blocks $a_1$ and $a_2$ depending upon the intercentral distance between both blocks.

The repulsive force balancing model is expressed by the balancing equation (3). Herein, the empirical constant $k_{ij}$ is previously set in the RAM.

According to the repulsive balancing model, the repulsive force is exerted between both blocks. In particular, as the intercentral distance is less than $a_{ij}$ and hence any overlapping is produced between both blocks, larger repulsive force is exhibited in response to the degree of the overlapping.

Further, the solid line C in the figure represents an attractive/repulsive force balancing model where the foregoing solid lines A and D are summed up. The model is expressed by following equation (4).

$$f = -c_{ij}(L-a_{ij}) + k_{ij}a_{ij}^2/L^2 \qquad (4)$$

Figure 15A:
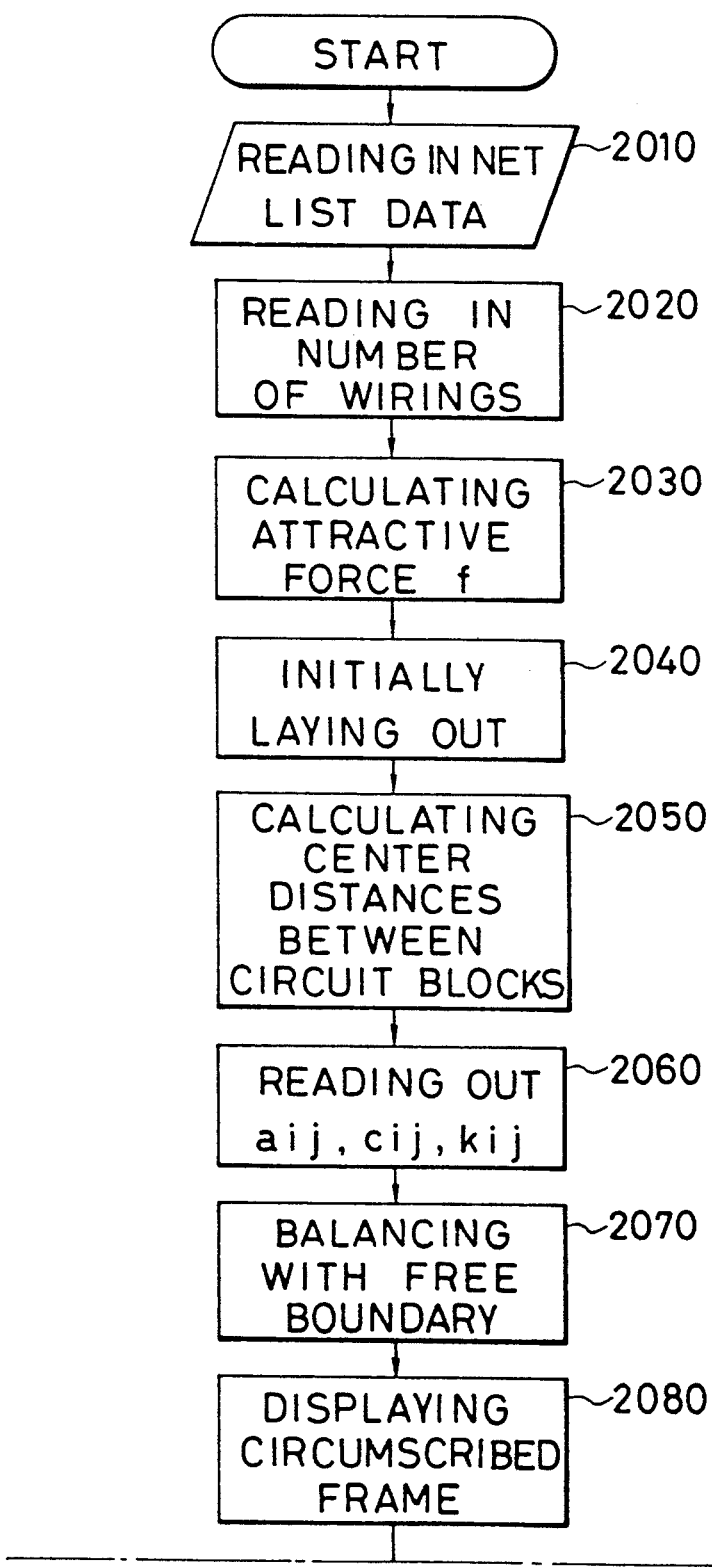
FIGS. 15A and 15B are flow charts illustrating the operation of the third embodiment.
Figure 15B:
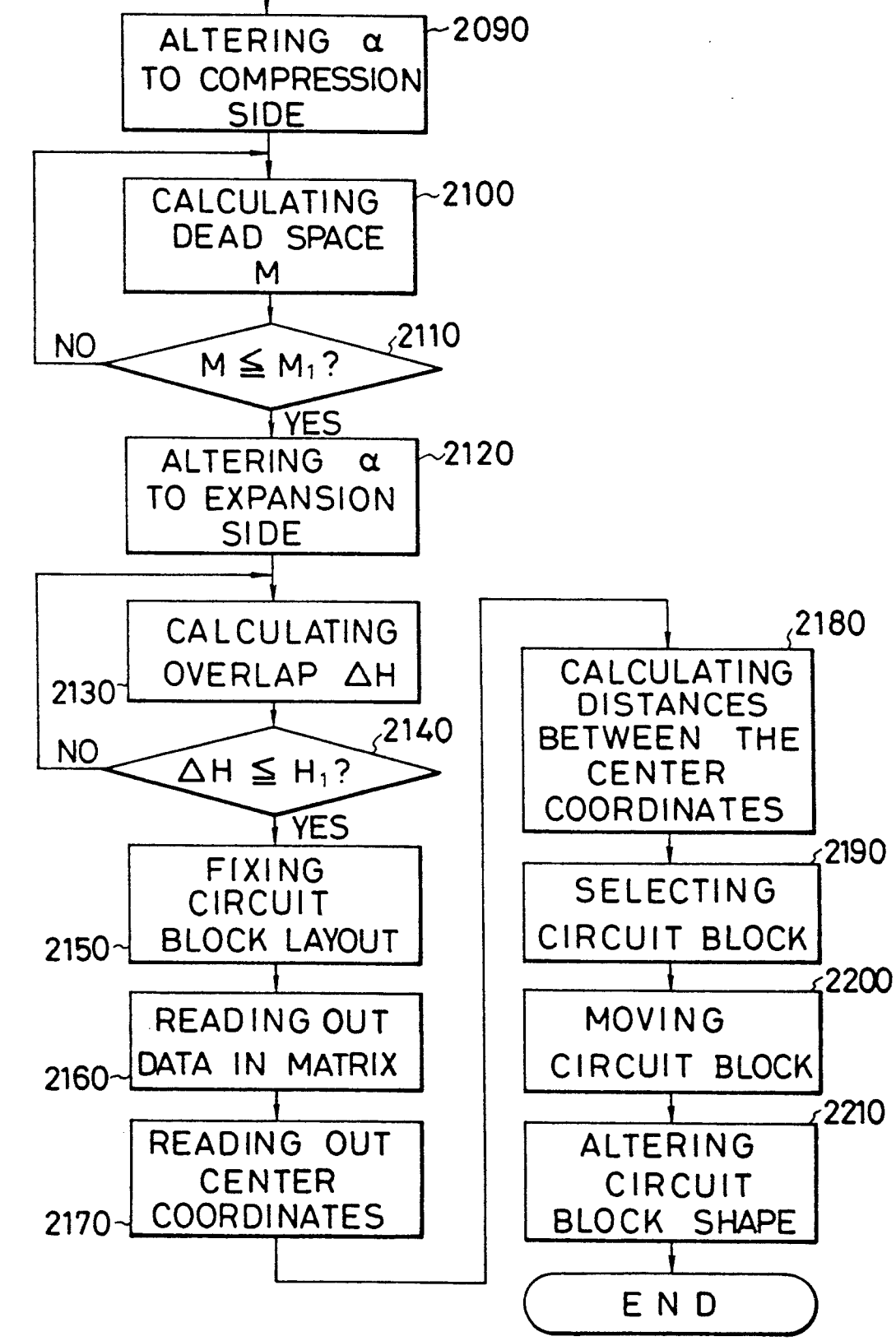

In succession, operation of the third embodiment will be described with reference to the flow chart illustrated in FIG. 15.

Figure 16:
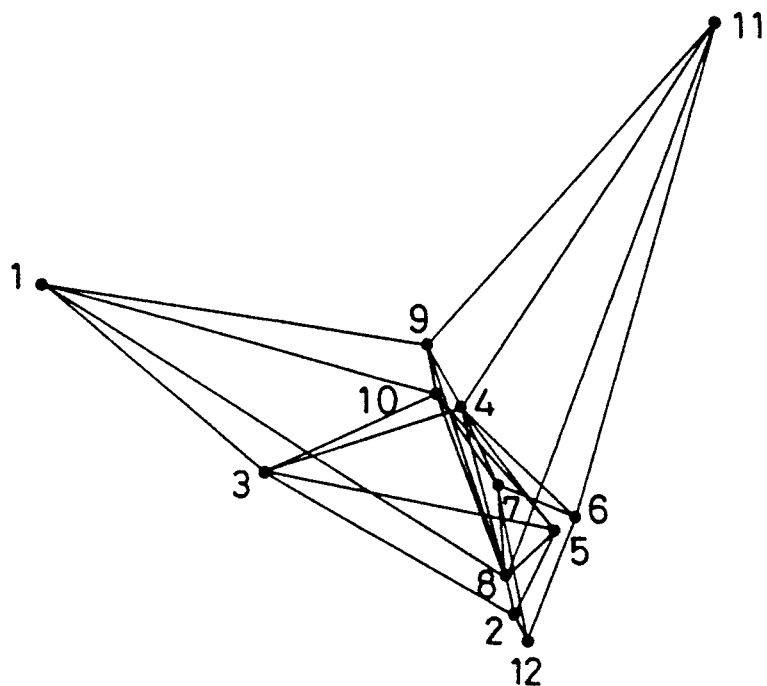
FIGS. 16 through 19 and FIG. 21 are views each illustrating the layout of circuit blocks that undergo layout processing in the third embodiment.

In step 2010, the CPU reads therein the net list data temporarily stored in the RAM. The initial layout of such circuit blocks as illustrated for example in FIG. 16 is executed as follows with use of the attractive force balancing model indicated by the solid line A of FIG. 3 where circuit blocks are ignored in their sizes or have no size.

First, in step 2020, the number of the wirings among the circuit blocks is read in from the net list data.

In step 2030, the number of the wirings read in as such (corresponding to $c_{ij}$ in the foregoing equation) is substituted for into the equation (2), on the basis of which the attractive force (f) is in turn calculated.

Finally, in step 2040, the attractive force obtained in step 2030 is used to balance the circuit blocks and complete the initial layout of the same.

An initial layout illustrated in FIG. 16 is displayed on a display screen. The boundary conditions of the initial layout is assumed to be a free boundary. Herein, numerals in the figure designate the numbers of the circuit blocks.

According to the initial layout, the attractive force corresponding to the number of the wirings between the circuit blocks is exerted between the circuit blocks, so that the circuit blocks with the increased number of the wirings are laid out more closely. Therefore, the circuit blocks can relatively be laid out so as to more reduce final wiring distances thereamong.

Herein, it is also possible to execute such initial layout for circuit blocks which are given sizes without being ignored. However, since the initial layout of circuit blocks is performed using the attractive force balancing, there is produced much overlapping among the circuit blocks, so that it is preferable in view of easing the observation on a display screen to execute the initial layout with the assumption that those circuit blocks do not have any size.

Figure 17:
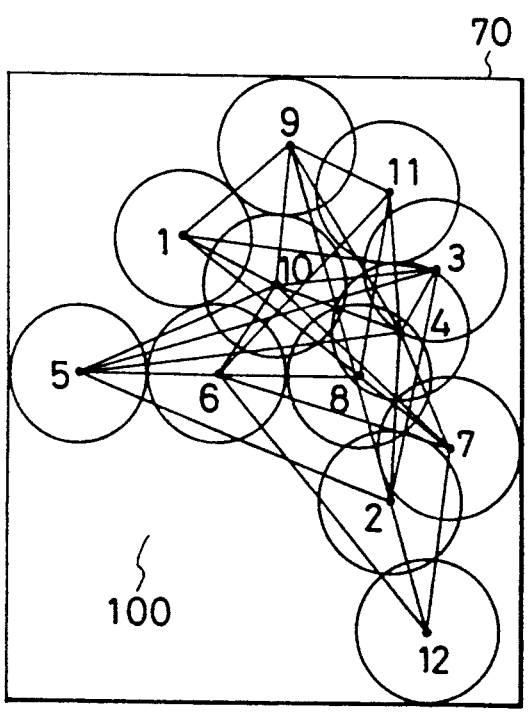

After the initial layout, in order to eliminate any overlapping among the circuit blocks produced in consideration of the sizes of the circuit blocks, there is executed balancing by a free boundary which is to relay out the circuit blocks subjected to the initial layout. In the free boundary balancing, there is used a balancing equation in which the repulsive force is exerted depending upon the degree of overlapping together with both attractive/repulsive forces indicating by the solid line C of FIG. 3. Hereby, the circuit blocks are re-laid out as illustrated in FIG. 17 and displayed on a display screen. Herein, in FIG. 17, solid lines connecting among the centers of the circuit blocks represent wirings formed among those circuit blocks.

Figure 21:
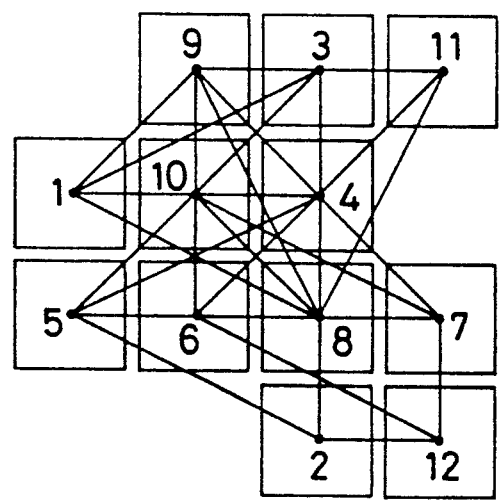

In the free boundary balancing, the circuit block is configured as a circle (and actual circuit block is configured as a rectangle as illustrated in FIG. 21). The reason why the circuit block is configured as a circle is that the circuit block is eased in movement on a display screen as compared with a case of rectangle, and if with the rectangle the circuit blocks are liable to produce any overlapping thereamong at corners thereof, whereas if with a circle such overlapping can be prevented from being produced because the circle does not have any corner. But, use of the free boundary balancing and processings thereafter are not precluded even with rectangles matched with actual shapes of the circuit blocks.

The free boundary balancing is conducted as follows.

In step 2050, the intercentral distances among the circuit blocks after the initial layout are calculated as follows:

$$(|X_1-X_2|^2 + |Y_1-Y_2|^2)^{\frac{1}{2}} \qquad (5)$$

where $(X_1, Y_1)$ and $(X_2, Y_2)$ are the center coordinates of each circuit block.

In step 2060, there are read out the just-mentioned intercentral distance, the diameter of the circuit block denoted by $a_{ij}$, the number of wirings between the circuit blocks denoted by $c_{ij}$ and the empirical characteristic values denoted by $k_{ij}$, and in step 2070 the values read out as such are substituted for into the equation (4) to calculate the attractive or repulsive force f which are in turn used to take free boundary balancing.

According such free boundary balancing, circuit blocks with the more increased number of wirings are laid out more closely to each other, so that there is not lost the requirement of shortening the total wiring length. Additionally, repulsive force is exerted depending upon the degree of overlapping between the circuit blocks, so that there is reduced any overlapping among the circuit blocks.

Now, it should be noticed that in the re-laid-out configuration of the circuit blocks through the free boundary balancing in the step 2070 as illustrated in FIG. 17, a wide dead space is existent as indicated by the numeral 100 in which there is no circuit block, and at the same time some overlapping is left behind among the circuit blocks owing to the attractive force springs. In order to eliminate the dead space and the remaining overlapping, compaction of the circuit block layout is executed.

Figure 18:
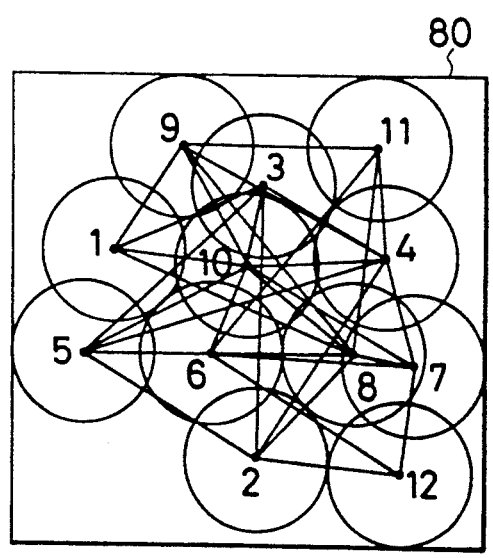

In step 2080, the CPU provides a deformation rate $\alpha$ to display on the screen a compressible or expandable rectangular circumscribed frame denoted by the numeral 80 in FIG. 18 around the re-laid-out circuit blocks after rendered to the free boundary balancing. As the circumscribed frame is moved by compression or expansion, the circuit blocks are also moved on the screen.

In step 2090, the deformation rate $\alpha$ of the circumscribed frame is altered to the compression side. Herein, the deformation rate $\alpha$ can select different values in X and Y directions.

In step 2100, the area of the dead space is calculated, and in step 2070, the area M of the dead space is compared with a given value $M_1$. Herein, the dead space area is deriverable by the CPU which calculates an area outside circles representative of the circuit blocks on the screen.

In step 2110, if the dead space area is judged to be less than $M_1$, the next procedure is executed as the dead space being eliminated by the compaction. Upon the compaction, the circuit blocks are balanced using the balancing equation of the attractive/repulsive force balancing indicated by the solid line C in FIG. 3. In this situation, the requirement of the minimum total wiring length is maintained. Therefore, the layout of the circuit blocks as illustrated in FIG. 18 for example is yielded and displayed on the screen.

Alternatively, if the dead space area exceeds $M_1$ in the step 2110, $\alpha$ is further altered to the compression side and the compaction is continued until the dead space area becomes less that $M_1$.

Whereas the dead space can be eliminated in the layout after the compaction, there is left behind the overlapping owing to the attractive force springs. Accordingly, the overlapping left behind owing to the attractive force springs is eliminated by the repulsive force balancing indicated by the solid line D of FIG. 3 which is yielded by cutting off the attractive force springs immediately after the production of the overlapping. More specifically, in step 2120, $\alpha$ of the circumscribed frame 30 is altered to the expansion side, and in step 2130 the degree of the overlapping among all circuit blocks is calculated. The degree $\alpha H$ of the overlapping can be estimated by $$\Delta H = 2l - b_{ij}$$

where l is a radius of a circle representative of the circuit block,
$b_{ij}$ the intercentral distance between the circuit blocks.

In succession, in step 2140, the degree $\Delta H$ of the overlapping is judged on whether or not it is less than a predetermined value $H_1$ (zero for example), and the circumscribed frame is expanded until $\Delta H$ becomes less than the predetermined value $H_1$ and the balancing with use of the repulsive force springs is continued. For the predetermined value $H_1$, a proper value is selected at need, typically zero for example.

In step 2150, the layout of the circuit blocks is fixed at the time the overlapping is eliminated ($\Delta H = 0$), and the circumscribed frame is removed. Hereby, a layout illustrated in FIG. 19 for example is yielded and displayed on a display screen. The positional data of the circuit blocks after the compaction has been completed is stored in the RAM.

Figure 19:
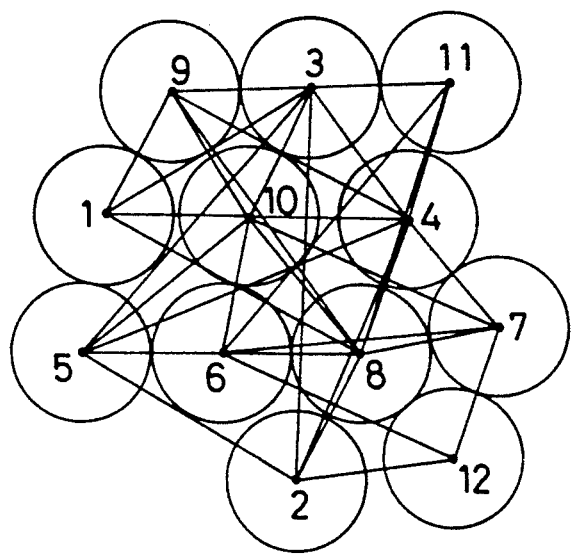

With the compaction described above, any dead space and any overlapping can be eliminated without sacrificing the requirement of the total wiring length among the circuit blocks being minimum, as illustrated in FIG. 19.

Herein, for the free boundary balancing and the compaction, instead of the use of the balancing equation with both attractive/repulsive forces indicated by the solid line C in FIG. 3, there may be used an attractive force spring model indicated by the solid line A when the distance L between the circuit blocks $a_1$ and $a_2$ exceeds the contact position $a_{ij}$ therebetween, and the balancing is existent on the broken line B when the distance $L = a_{ij}$, and further a repulsive force spring model following a quadratic equation indicated by the solid line D may be used when the distance L is less than $a_{ij}$.

Additionally, for the compaction processing, there may be used a modification to eliminate the overlapping and the dead space, in which after said circumscribed frame is formed for the layout of the circuit blocks after subjected to the free boundary balancing, the deformation rate $\alpha$ is set so as to compress the circumscribed frame and the circuit blocks at that time is laid out only with the repulsive force balancing expressed by a balancing equation indicated by the solid line D in the FIG. 3. In this modified processing, calculation time can be shortened compared with the compaction disclosed in the foregoing embodiment because the calculation of the attractive force is not required, whereas the requirement of the total wiring length being minimum may sometimes be lost.

Further, although in the aforementioned embodiment the attractive/repulsive force balancing was taken with the compression of the circumscribed frame, there may instead be used the attractive/repulsive force balancing and the repulsive force balancing alternately upon the compression of the circumscribed frame to eliminate the overlapping produced owing to the attractive force springs only with the repulsive force balancing by cutting off the attractive force springs just after the production of the overlapping. In this situation, since the attractive force springs are cut off just after the production of the overlapping, the circuit blocks are facilitated in movement, and since there is used the attractive/repulsive force balancing, the dead space and the overlapping can be eliminated without loss of the requirement of the total wiring length being minimum. However, since the attractive force springs are frequently cut off and the repulsive force balancing is taken each time the springs are cut off, the calculation time increases correspondingly.

After the compaction, the layout of the circuit blocks is adjusted such that they are arranged in the form of a regular lattice.

Figure 20:
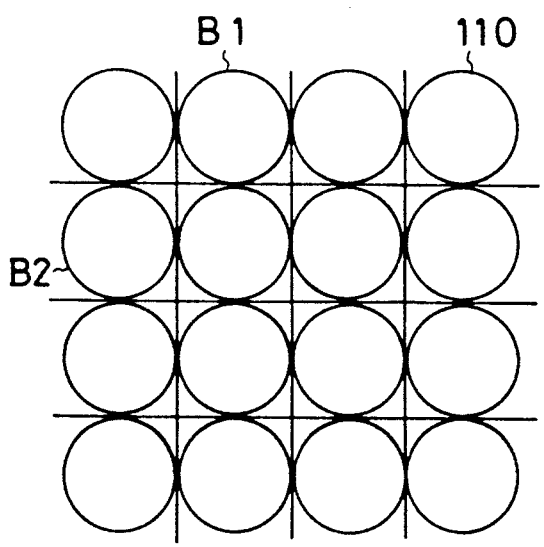
FIG. 20 is a view illustrating the layout of circuit blocks arranged regularly in the form of a lattice in the third embodiment.

The foregoing data base 121 has held absolute positional data, on the screen, of the circuit blocks 110 arranged in the regular lattice as illustrated in FIG. 20. The lattice-shaped layout corresponds to the set position of the PLEs on the PLD.

In step 2160, the CPU reads the positional data of the circuit blocks of FIG. 20 from the data base. The positional data includes for example the center coordinates of a circle representative of the circuit block.

In succession, in step 2170, the CPU reads the center coordinates, on the screen, of all circuit blocks (shown by circles) after the compaction illustrated in FIG. 19.

In step 2180, the CPU calculates intercentral coordinate distance between each circuit block illustrated in FIG. 19 and circuit blocks laid out into the regular lattice illustrated in FIG. 20 on the basis of the equation (5). The calculation is executed for all circuit blocks after the compaction.

In step 2190, for each circuit block after the compaction, a circuit block having a minimum intercentral distance is selected from the circuit blocks illustrated in FIG. 20. Noticed circuit blocks 9 and 1 after the compaction illustrated in FIG. 19, a circuit block that is minimum in the intercentral distance with respects to the circuit block 9 corresponds to the circuit block $B_1$ of the FIG. 20 and the like circuit block with respect to the circuit block 1 corresponds to $B_2$.

Successively, in step 2200, the circuit block 1 of FIG. 19 is moved on the screen to the indicated position of the circuit block $B_1$ of FIG. 20 and the circuit block 9 is moved to the indicated position of $B_2$. Upon executing this processing for all circuit blocks after the compaction, the circuit blocks after the compaction can be adjusted into the layout in the form of a lattice.

In step 2210, upon the movement of the circuit block in the step 2200, the shape of the circuit block is altered from a circle to a rectangle. Hereby, as illustrated in FIG. 21, there is provided a lattice-shaped layout of rectangular circuit blocks which is in turn displayed on the screen. Herein, in the layout of the circuit blocks of FIG. 21, indication of the switching stations (SSs) is ignored and only the circuit blocks are enhanced.

Further, it is a matter of course that the circuit block may be adjusted as the circle and altered finally to the rectangle.

As described above, all processings of designing the layout of circuit blocks are now completed.

In succeeding processes, the circuit blocks finally obtained as above are laid out as illustrated in FIG. 21, and further wiring directions in the SSs existent on the PLD together with the circuit blocks are determined and wirings are formed among the laid-out circuit blocks.

In succession, a fourth embodiment of the present inventive apparatus will be described.

In the fourth embodiment, there is constructed a macro circuit block as an assembly of a plurality of circuit block existent in a PLD, and the circuit blocks that constitute the macro circuit block are initially laid out integrally or without being separated from each other.

Such a macro circuit block is established by connecting circuit blocks in the direction of the X axis and/or in the direction of the Y axis under the multiple point constraint.

In the present embodiment, the circuit blocks are bound in a 3×1 matrix.

The input device designates to the CPU circuit the blocks to be bound and a binding direction. A macro circuit block is subjected to a layout design with other macro circuit blocks and/or circuit blocks not bound such that circuit blocks constituting the macro circuit block are not separated away.

Figure 22:
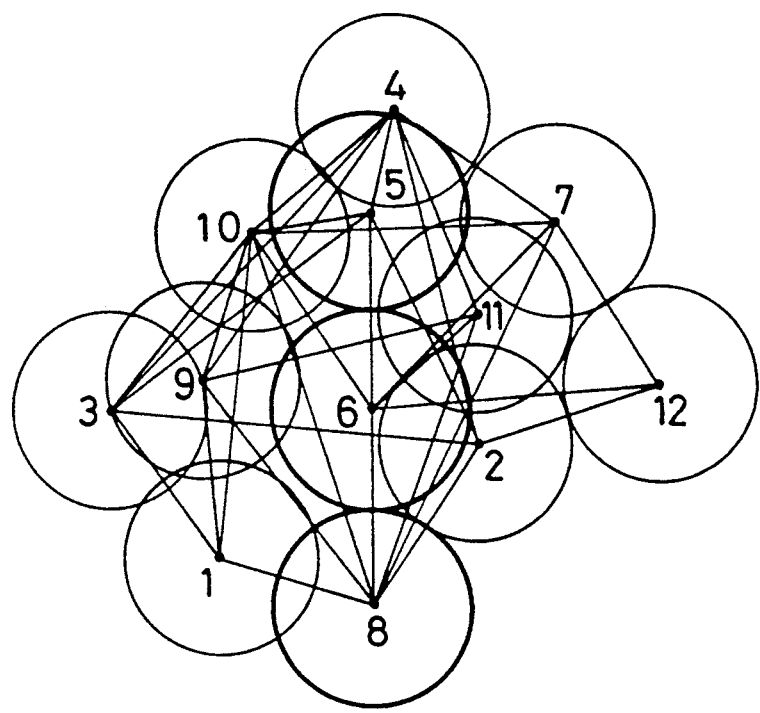
FIGS. 22 through 24 and FIG. 26 are views each illustrating the layout of circuit blocks subjected to layout processing by a fourth embodiment of the apparatus of the present invention.
Figure 23:
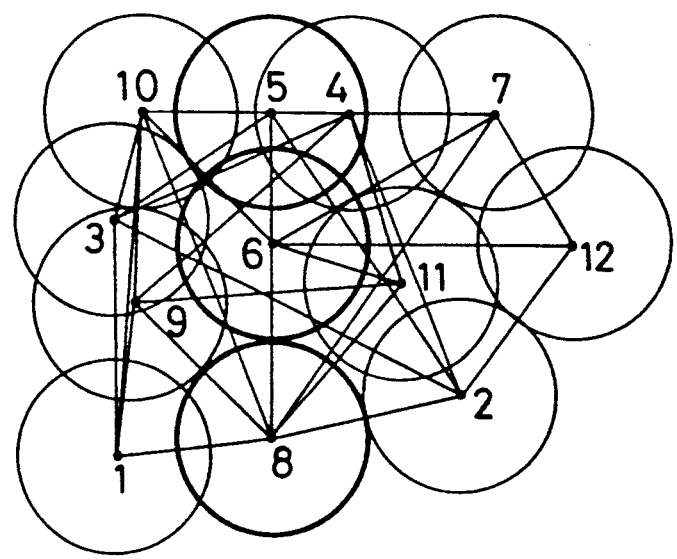
Figure 24:
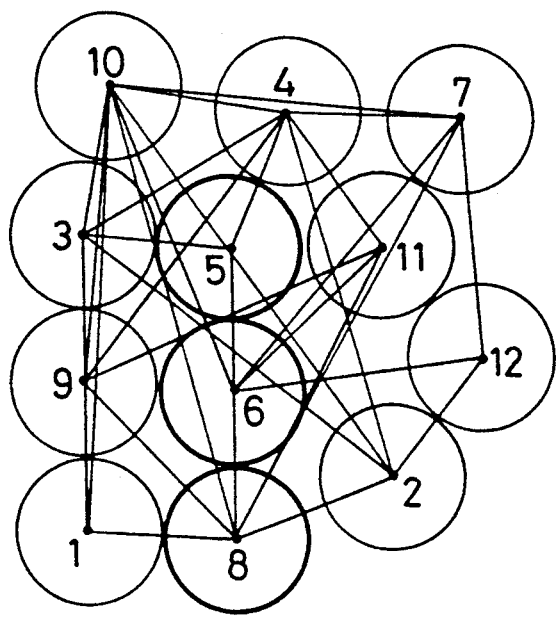

Referring now to FIG. 22, a layout screen is illustrated in which three circuit blocks 5, 6 and 8 are bound into a 3×1 matrix to form a macro circuit block and rendered to free boundary balancing, and further referring to FIGS. 23 and 24, layout screens after compaction processing are illustrated. The process of the initial layout, free boundary balancing, and compaction are identical with those in the aforementioned embodiment.

In the present free boundary balancing and compaction, attractive/repulsive balancing is taken. Under the binding conditions, macro circuit blocks are not separated away from the binding direction even under the attractive and repulsive forces by the attractive and repulsive springs illustrated in FIG. 3, to take a balance between the macro circuit block and the other circuit blocks.

Figure 25:
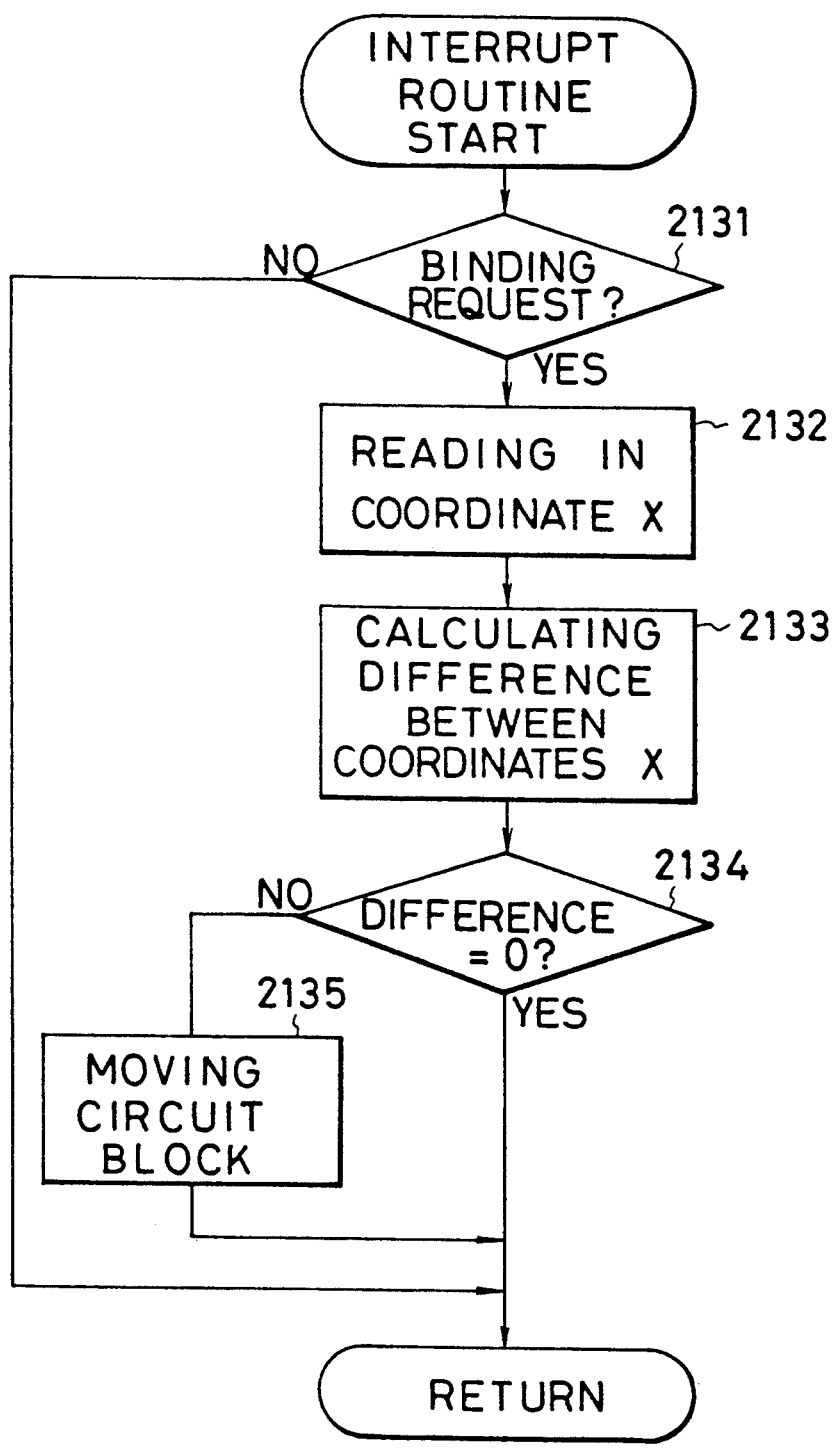
FIG. 25 is a flow chart illustrating the operation capable of execution of restriction processing to circuit blocks in the fourth embodiment.

Such binding on the circuit blocks is executed by interrupt processing repeated each predetermined time, as illustrated in FIG. 25.

First, in step 2131, it is judged whether or not there is existent any binding request.

In step 2132, the CPU reads thereinto the coordinates X of the centers of the circuit blocks 5, 6 and 8 in succession, and in step 2133 the CPU calculates differences between the coordinate X of the center of the circuit block 6 and the coordinates X of the centers of the other circuit blocks 5, 8 and in step 2134 judges on whether or not the differences are zero. If the differences are zero, the processing is completed and the successive compaction processing is continued. If the difference is not zero, in step 2135 the circuit blocks 5, 8 are moved such that the coordinates X of the circuit blocks 5, 8 are coincident with the coordinate X of the circuit block 6. Also for the coordinate Y, identical processing to that in the coordinate X is performed.

Thus, there is established a layout illustrated in FIGS. 22 through 24 in which the circuit blocks 5, 8, 9 are bound and moved in an integrated manner.

Also in the present embodiment, a layout after the compaction is adjusted. Also in the adjustment processing, the foregoing steps 2160 through 2210 are executed to adjust the circuit block layout after the completion of the compaction.

Figure 26:
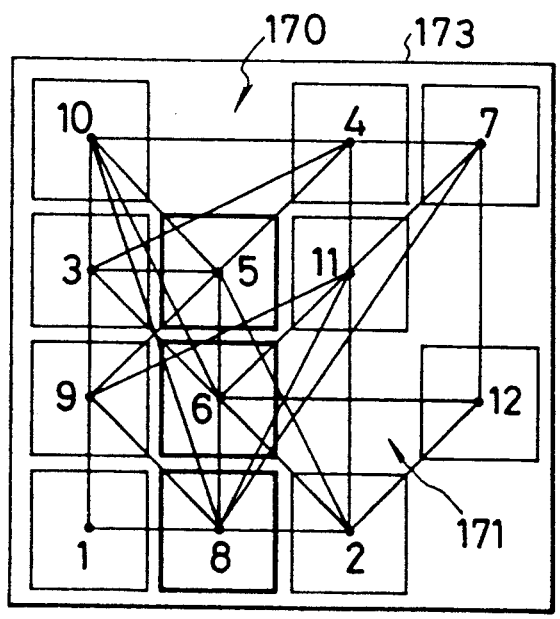
Figure 27:
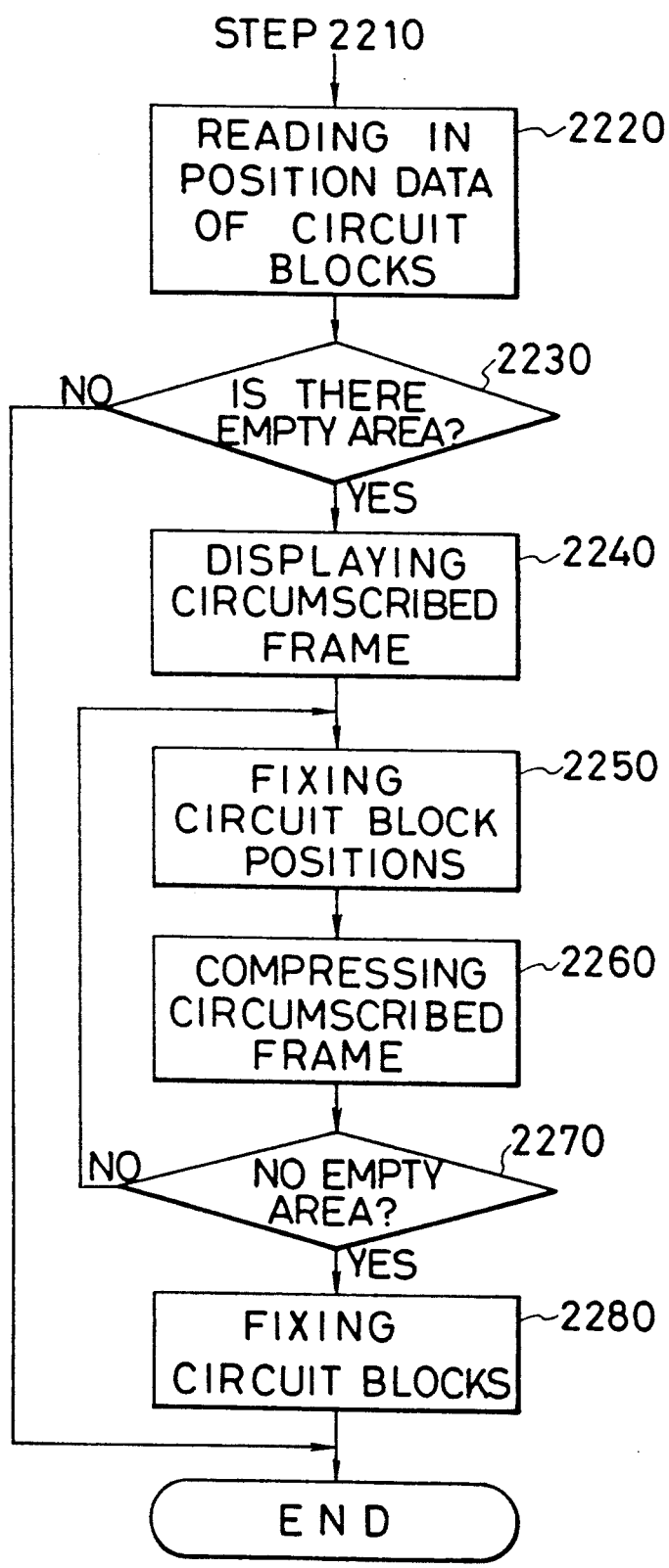
FIG. 27 is a flow chart illustrating a procedure of filling a blank space after the layout of circuit blocks is adjusted in the fourth embodiment.

A layout after the layout adjustment is as illustrated in FIG. 26. In the layout, there are existent blank spaces 170, 171 where no circuit block is disposed. No blank space is preferable because the total wiring length is reduced if so. The blank spaces originate from a fact that the circuit blocks 5, 6, 8 are bound and laid out. In the present embodiment, the circuit blocks after the adjustment is re-adjusted to eliminate such a blank space. A procedure of the re-adjustment is illustrated in FIG. 27.

After the foregoing step 2210 is completed, in step 2220, the CPU reads thereinto positional data of the circuit blocks after the adjustment shown in FIG. 26.

In step 2230, it is judged whether or not any blank space is existent. The judgement is as follows, for example.

The positional data after the adjustment is assumed as data where the center coordinates of each unit lattice and the number of each circuit block are related to each other in a one-to-one correspondence. The data is stored in the RAM. Additionally, there is assumed as a blank space any unit lattice which is existent inside a blank space of a circumscribed frame 173 described later and has no correspondence to the number of a circuit block.

In step 2240, as illustrated in FIG. 26, the circumscribed frame is displayed on the screen after the layout is adjusted. The circumscribed frame is assumed to be compressible in the direction of X axis and/or Y axis.

In step 2250, the circuit blocks 5, 6, 7 for which binding is required are fixed in position thereof, and in step 2260, the circumscribed frame is compressed. Thereupon, no circuit block is moved provided the circumscribed frame is compressed in the direction of the axis Y. Alternatively, provided the circumscribed frame is compressed in the direction of the axis X, the circuit blocks 4, 7 are moved to fill the blank space 170 therewith and the circuit block 12 is moved to fill the blank space 171 therewith.

In step 2270, it is judged whether or not there is existent any blank space, followed by the re-adjustment processing being continued until any remaining blank space disappears.

Figure 28:
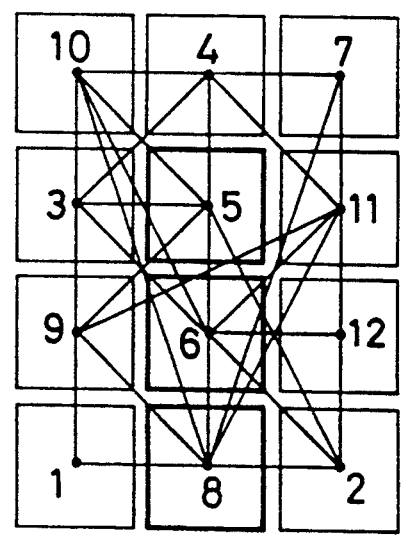
FIG. 28 is a view illustrating the layout of circuit blocks after readjusted, yielded by the processing in FIG. 27.

Judged that no blank space is existent, in step 2280, the layout of the circuit blocks at that time is fixed and the positional data of the circuit blocks are stored in the RAM. Hereby, as illustrated in FIG. 28, there is yielded the layout of the circuit blocks without any blank space. According to the layout, the layout design of the minimum total wiring length is achieved even when a plurality of the circuit blocks are bound to form a macro circuit block.

In succession, a fifth embodiment of the present inventive apparatus will be described.

Figure 29A:
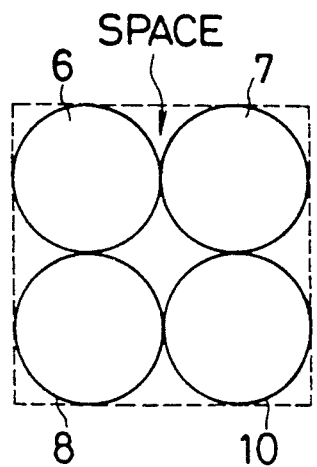
FIGS. 29A and 29B are views illustrating the concept of a restriction of a 2×2 matrix.
Figure 29B:
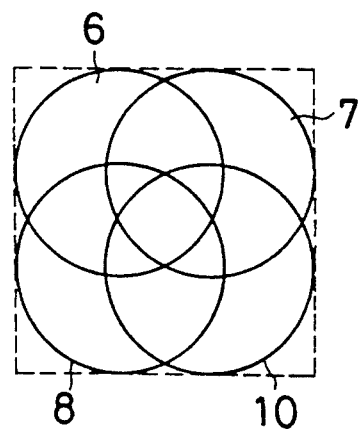

In the fifth embodiment, the circuit blocks 6, 7, 8, 10 are bound into a 2×2 matrix. The circuit blocks 6, 7, 8, 10 are indicated by a large circle unlike the fourth embodiment. The reason is that the repulsive force shown in FIG. 3 is weak in the vicinity of contacts among the circuit blocks, and other circuit blocks enter those contact portions upon the free boundary balancing and the compaction to sometimes destroy the binding among the circuit blocks. Accordingly, the circuit blocks 6, 7, 8, 10 shown in FIG. 29A are given large circles as illustrated in FIG. 29B. Thus, any overlapping is produced among the circuit blocks to eliminate any space which any other circuit block enters, so that the layout design can be achieved without destroying the binding among the circuit blocks.

Figure 30:
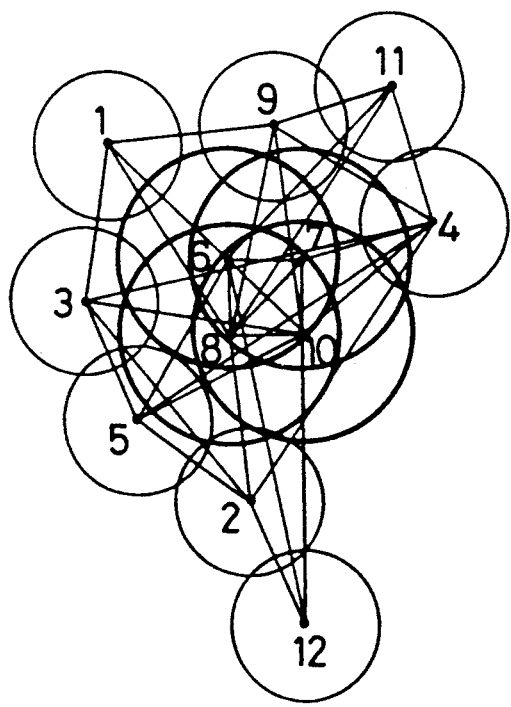
Figure 31:
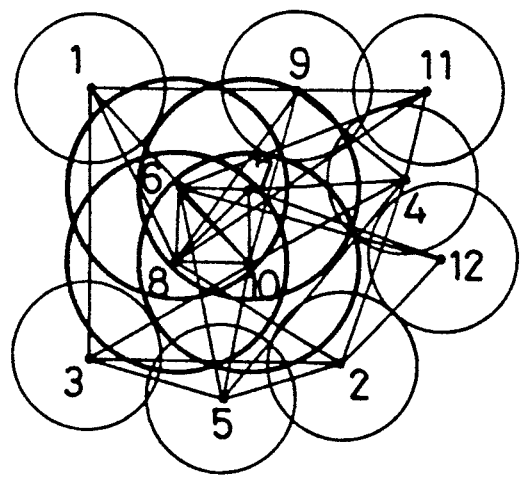

For those circuit blocks, there are executed the process of the initial layout, free boundary balancing, compaction, and adjustment as in the aforementioned respective embodiment. FIG. 30 is a view illustrating the layout of the circuit blocks after the free boundary balancing is taken and FIGS. 31 and 32 are views each illustrating the layout of the same after the compaction is done.

The initial layout, free boundary balancing, and compaction in the present embodiment are executed as in the aforementioned embodiments. The adjustment is performed according to the same processing shown in FIG. 25. FIG. 33 illustrates the circuit blocks after the layout adjustment.

Now, it should be noticed that since the layout design is done under the conditions that the circuit blocks 6, 7, 8, 10 are bound, the circuit blocks 4, 12 correspond to one unit lattice and the circuit blocks 10, 2 do the same after the layout adjustment. Therefore, any overlapping among the circuit blocks is produced.

Accordingly, after the processing in the step 2210 is completed, it is judged whether or not there is existent any overlapping among the circuit blocks. The judgement is executed depending upon whether or not the circuit blocks shown in FIG. 32 correspond to one circuit block shown in FIG. 30.

When any overlapping among the circuit blocks is judged to be existent, the circuit block is moved to a space adjacent to a portion where the circuit blocks are overlapped, in order to remove the overlapping among the circuit blocks. In the present embodiment, the circuit block 12 is separated from the circuit block 4 and moved, and the circuit block 2 is separated from the circuit block 10 and moved. At this time, it is necessary to distinguish the circuit block to be moved from the circuit block not to be moved. This is done by giving priority to the circuit block 4 because the circuit block 4 is adjacent to the circuit block 11 upon the compaction being completed. Further, since the circuit block 10 has been bound to the circuit blocks 6, 7, 8 the circuit block 2 can be distinguished from the circuit block 10 and moved by giving priority to the circuit block 10.

Thereupon, the circuit blocks are moved, for minimization of the wiring lengthly toward a blank unit lattice located in a direction of a position of the center of gravity of the circuit blocks after the layout adjustment. Hereby, a layout illustrated in FIG. 34 can be obtained in which the overlapped circuit blocks are moved.

Thereafter, in order to remove the space, there is performed a processing to fill the blank unit lattice as in the processing shown in FIG. 27. Thus, since the overlapping circuit blocks and the blank unit lattice are finally eliminated, a layout which has been re-adjusted and has a minimum wiring length can be established as illustrated in FIG. 35.

Although in the present embodiment, such a spring model as illustrated in FIG. 3 was used, the balancing is achievable using any other balancing equation without being limited thereto. For example, although for the repulsive force balancing the reciprocal quadratic equation of L ($f=k_{ij} \cdot a_{ij}^2/L^2$) was used as shown in FIG. 3, reciprocal cubic and quadratic equations may also be used and the constant $k_{ij}$ may be altered in proper.

Additionally, although for the attractive force balancing the linear equation ($f=-c_{ij}(L-a_{ij})$) was used, any nonlinear equation may be used and $c_{ij}$ may be defined, instead of the number of wirings, a variable which increases depending upon the number of wirings.

Further, although in the third through fifth embodiments the circuit block was configured as a circle in the processings after the initial layout of the circuit blocks, the circuit block may be configured as a rectangle, an actual shape thereof without limitation thereto and the layout design may be executed from the initial layout.

Additionally, although the circuit block, which was configured as a circle was re-configured as a rectangle after the compaction had been completed and the layout adjustment had been taken, the circuit block may be re-configured as a rectangle after the completion of the compaction but before the layout adjustment and thereafter rendered to the layout adjustment.

Furthermore, the number of wirings may be set between each circuit block and the I/O pad to execute the layout processings such as the initial layout.

Herein, although in the fourth and fifth embodiments there were bound circuit blocks in the initial layout, free boundary balancing, compaction, and layout adjustment, the circuit blocks in a macro circuit block may at least be bound after the free boundary balancing.

Still more, although in the third through fifth embodiments a plurality of partial circuit blocks existent in a PLD were assumed as a macro circuit block, all circuit blocks may be divided to some sets of macro circuit blocks as in the first or second embodiment and with those marco circuit blocks having been bound a layout design among those macro circuit blocks and other macro circuit blocks may be executed.

Although in the embodiments of the multiple point binding the circuit block was configured as a circle, the present invention may, as a matter of course, be applied to a situation where the circuit blocks are configured as rectangles and bound. Thereupon, it is not necessarily required that the size of a bound rectangular macro circuit block is integer times the size of a non-bound circuit block and the size of the bound rectangular macro circuit block may be selected in proper.

Further, although in the aforementioned embodiments there were described the cases where the present invention was applicable to an SOG and a PLD, the present invention is, as a matter of course, applicable to layout designs of basic cells (comprising a plurality of unit cells) such as gate arrays and standard cells, without limitation thereto.

Figure 36A:
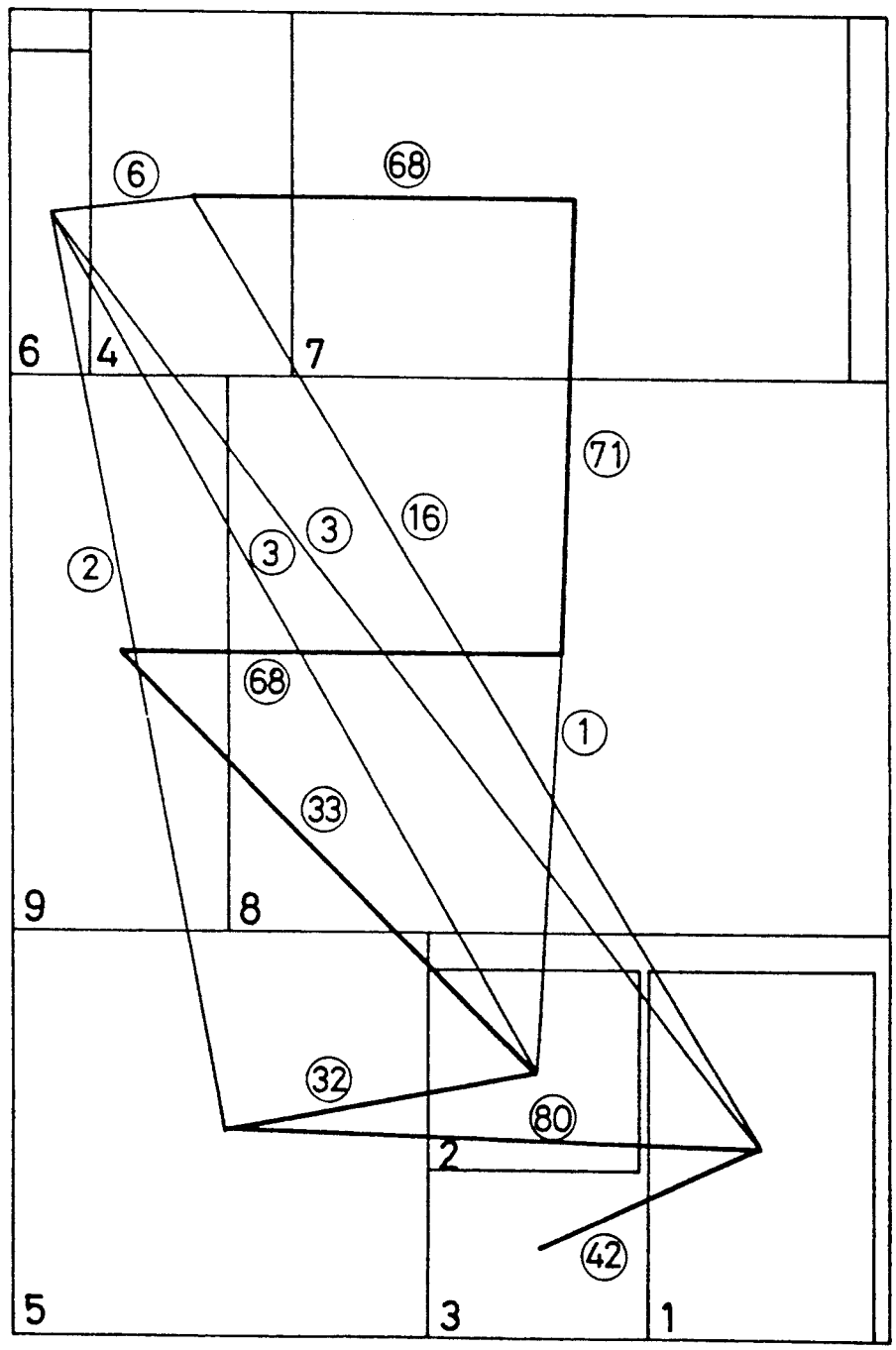
Figure 37:
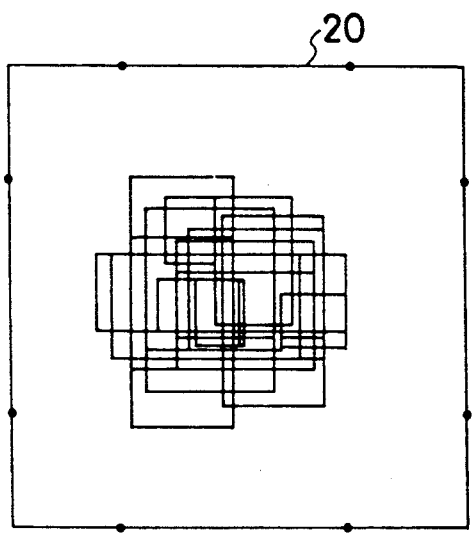
FIGS. 37 through 41 are diagrams each illustrating a procedure of prior practice.
Figure 38:
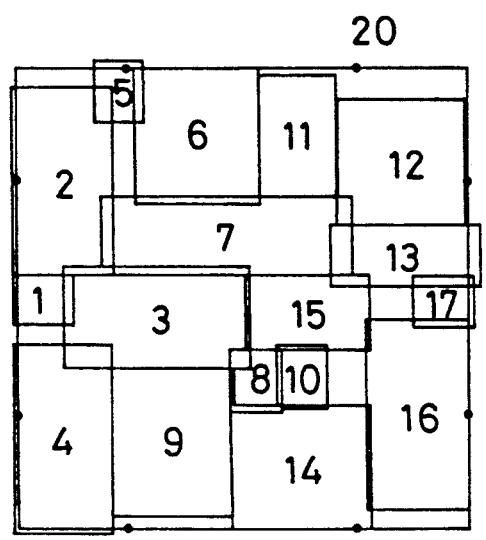
Figure 39:
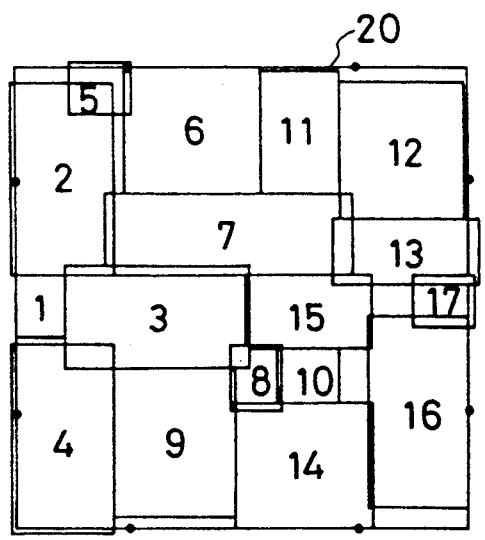
Figure 40:
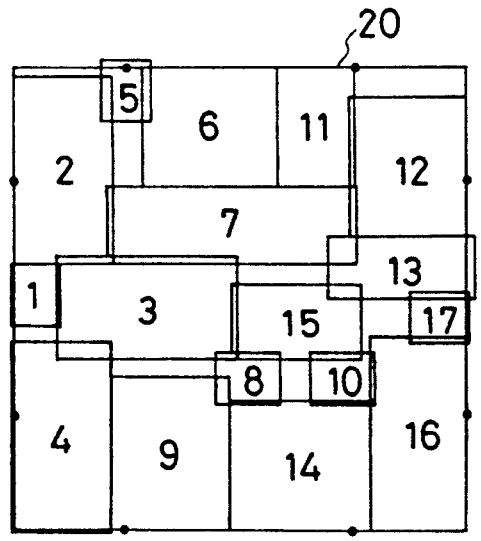
Figure 41:
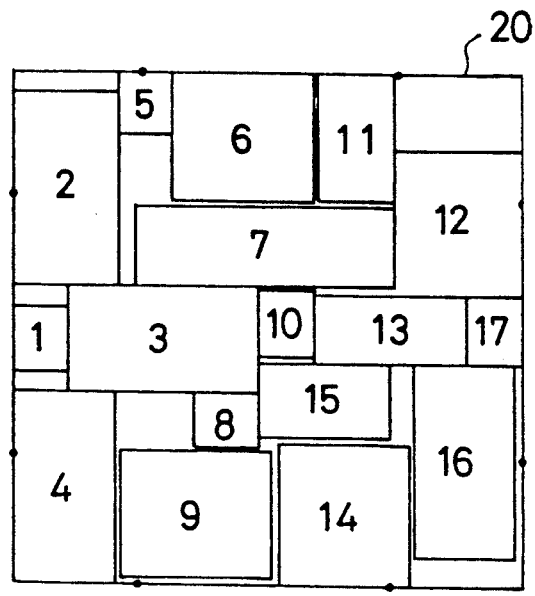
Figure 42:
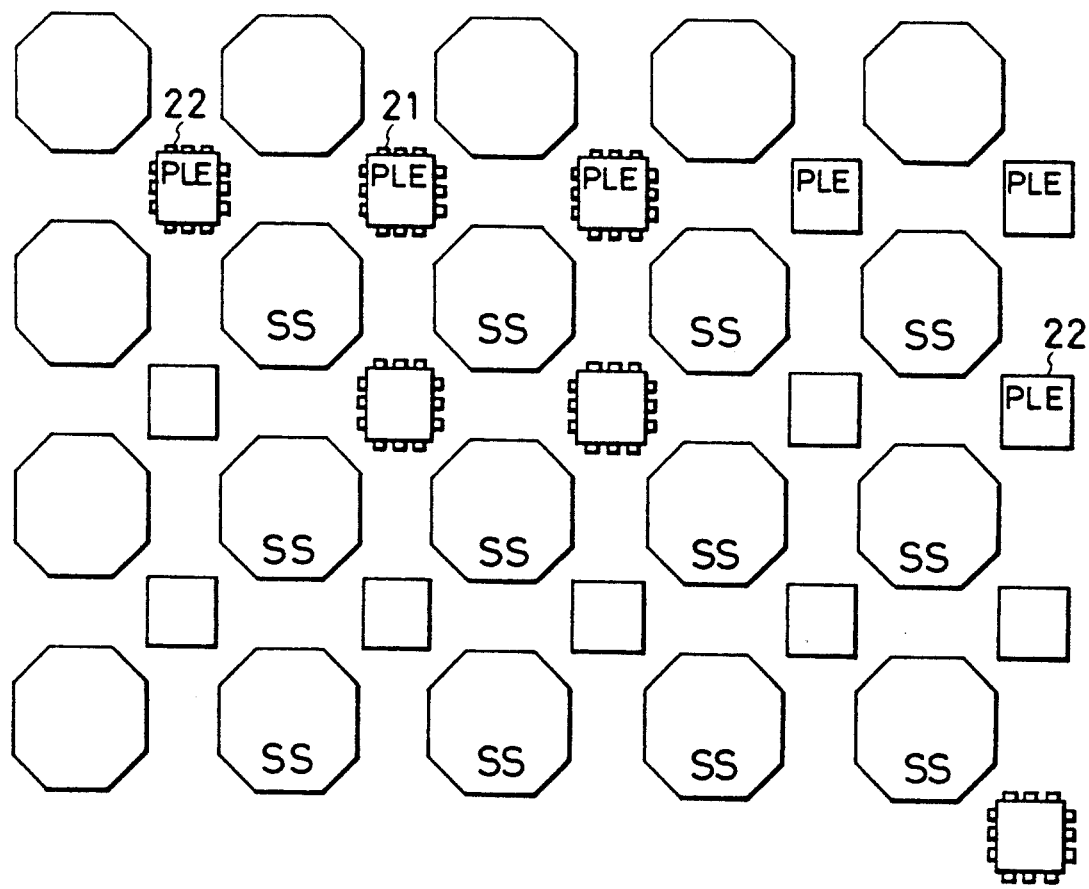
FIG. 42 is a view illustrating the simplified construction of a PLD.

To estimate effect of the present invention, inventors have designed a multiplier accumulator having about 7800 gates by the present invention using 9 circuit blocks and by the prior art using a dialogue graphic screen of a development tool for a CAD apparatus. Lay out obtained by the present invention is as shown in FIG. 36A and lay out obtained by the prior art is as shown in FIG. 36B. Working time, final chip area, and total wiring length (sum of distance between circuit blocks multipled by wiring number between the same) to lay out the 9 circuit blocks in a basic cell region (6780 mm×9520 mm) of a die frame (7904 mm×10700 mm) are shown in the following table 1.

As apparent from Table 1, working time according to the present invention is about one-tenth of that according to the prior art. Chip area obtained by the present invention is almost the same as that obtained by the prior art. Total wiring length between blocks obtained by the present invention is a little longer than that obtained by the prior art.

TABLE 1

|  | Present Invention | Prior Art (Manual operation using a Developent tool) |
| --- | --- | --- |
| Working time | 7 min. (Present Invention: 2 min. + Eliminating Overlap by Manual operation: 5 min.) | 70 min. |
| Chip Area | 6.366 × 8.190 = 52.13 mm² | 6.354 × 8.300 = 52.73 mm² |
| Total Wiring Length between Blocks | 1581 μm | 1125 μm |

What is claimed is:

1. A method of generating, in an automatic electronic design apparatus, electronic final layout data corresponding to a circuit block layout for manufacturing an integrated circuit, the automatic electronic design apparatus including a layout specification memory containing electronic circuit block data corresponding to circuit blocks, a layout information memory and a processing unit, said method comprising the steps of:
    (a) from the electronic circuit block data, producing electronic rough layout data corresponding to an initial layout of said circuit blocks using a spring model of a mass point system in which infinitesimal circuit blocks are coupled through springs;
    (b) from the electronic rough layout data, producing electronic revised layout data corresponding to a revised layout of said circuit blocks by representing at least some of said circuit blocks as circles and eliminating overlap among the circles;
    (c) from said electronic revised layout data, generating electronic compacted layout data corresponding to a compacted layout of said circuit blocks to match an external perimeter shape of said circuit blocks as a whole with a frame of a die of the integrated circuit;
    (d) altering the electronic compacted layout data to form electronic reshaped layout data corresponding to a layout of reshaped circuit blocks where the representation of the at least some of said circuit blocks is reshaped from a circle to an actual shape;
    (e) from the electronic reshaped layout data, generating electronic expanded layout data corresponding to an expanded layout of circuit blocks by expanding each circuit block to provide a region for wiring;
    (f) from the electronic expanded layout data, producing electronic fixed layout data by fixing positions of said circuit blocks after adjusting an aspect ratio of each circuit block within a corresponding allowable range; and
    (g) from electronic fixed layout data, producing the electronic final layout data by wiring within and between fixed circuit blocks.

2. The method of claim 1 wherein said circuit blocks are represented as circles and rectangles.

3. The method of claim 1 wherein said electronic rough layout data corresponding to the initial layout is established based on an assumption of a free boundary using a spring model of an attractive force balancing type where only the attractive force is exerted between two circuit blocks based on an intercentral distance between the two circuit blocks.

4. The method of claim 1 wherein said step of producing electronic revised layout data is performed based on a free boundary condition using a spring model of an attractive/repulsive balancing type where an attractive and a repulsive force is exerted between two circuit blocks based on an intercentral distance between the two circuit blocks.

5. The method of claim 1 wherein:
    said step of generating electronic compacted layout data uses a spring model of an attractive force balancing type where only the attractive force is exerted between two circuit blocks based on an intercentral distance between the circuit blocks when the two circuit blocks are non-overlapping;
    said step of generating electronic compacted layout data uses a spring model of a repulsive force balancing type where only the repulsive force is exerted between the two circuit blocks based on the intercentral distance between the two circuit blocks when the two circuit blocks are partly overlapped; and
    a die frame is assumed as a boundary condition.

6. The method of claim 1 wherein at least one step among said steps of generating electronic compacted layout data, altering the electronic compacted layout data, generating electronic expanded layout data, and producing the electronic final layout data uses a spring model of a repulsive force balancing type where only the repulsive force is exerted between two circuit blocks based on an intercentral distance between the two circuit blocks, and a die frame is assumed as a boundary condition.

7. The method of claim 1 wherein said step of producing the electronic final layout data fixes the aspect ratio except for a wiring region for each individual circuit block for which alteration of the shape of the individual circuit block is impossible.

8. The method of claim 1 wherein said spring model is expressed by a balancing equation as follows:

$$f = -c_{ij}(L - a_{ij}),$$

where f is an attractive force exerted between a circuit block i and a circuit block j, $c_{ij}$ is a number of wire connections between the circuit block i and the circuit block j, $a_{ij}$ is an intercentral distance between the circuit block i and the circuit block j when both circuit blocks make contact with each other, and L is a general intercentral distance between the circuit block i and the circuit block j.

9. The method of claim 1 wherein said spring model is expressed by a balancing equation as follows:

$$f = -k_{ij}a_{ij}^2/L^2,$$

where f is a repulsive force exerted between a circuit block i and a circuit block j, $k_{ij}$ is an empirical constant relating the circuit block i to the circuit block j, $a_{ij}$ is an intercentral distance between the circuit block i and the circuit block j when both circuit blocks make contact with each other, and L is a general intercentral distance between the circuit block i and the circuit block j.

10. The method of claim 1 wherein said spring model is expressed by a balancing equation as follows:

$$f = c_{ij}(L-a_{ij}) + k_{ij}a_{ij}^2/L^2,$$

where f is one of an attractive and a repulsive force exerted between a circuit block i and a circuit block j, $c_{ij}$ is a number of wire connections between the circuit block i and the circuit block j, $a_{ij}$ is an intercentral distance between the circuit block i and the circuit block j when both circuit blocks make contact with each other, L is a general intercentral distance between the circuit block i and the circuit block j, and $k_{ij}$ is an empirical constant relating the circuit block i to the circuit block j.

11. An automatic electronic design apparatus having a layout specification memory containing electronic circuit block data corresponding to circuit blocks for generating electronic final layout data corresponding to a circuit block layout for manufacturing an integrated circuit comprising:

(a) means for producing, from the electronic circuit block data, electronic rough layout data corresponding to an initial layout of said circuit blocks using a spring model of a mass point system having an attractive force corresponding to a number of wire connections between said circuit blocks;

(b) means for producing, from the electronic rough layout data, electronic revised layout data corresponding to a revised layout of said circuit blocks using a spring model having a repulsive force corresponding to a degree of overlapping between said circuit blocks such that any overlapping among said circuit blocks according to said initial layout is eliminated; and (c) means for fixing, from the electronic revised layout data, electronic fixed layout data by fixing positions of said circuit blocks after adjusting a layout of said circuit blocks corresponding to a compacted layout of said circuit blocks such that said circuit blocks are laid out regularly in a matrix form; and (d) means for generating, from the electronic fixed layout data, the electronic final layout data by wiring between fixed circuit blocks.

12. The automatic electronic design apparatus of claim 11 further comprising means for entering the electronic circuit block data based on a function of a corresponding circuit block and for storing the electronic circuit block data in the layout specification memory.

13. The automatic electronic design apparatus of claim 12 wherein said apparatus further includes:

macro circuit block forming means for producing, from the electronic circuit block data, electronic macro circuit block data corresponding to an assembly of a plurality of said circuit blocks; and integration/layout processing means for integrating said electronic macro circuit block data with said electronic circuit block data so that said electronic final layout data is generated using said electronic macro circuit block data as electronic circuit block data.

14. The automatic electronic design apparatus of claim 12 wherein said apparatus further includes:

means for generating electronic circumscribed frame data corresponding to a rectangular circumscribed frame around said circuit blocks arranged according to said electronic revised layout data;

means for altering said electronic circumscribed frame data by compression;

means for calculating electronic area data corresponding to an area of a dead space where no circuit block exists; and means for further altering said electronic circumscribed frame data by compression when said calculated electronic area data indicates that the dead space exceeds a predetermined area value and for compacting the electronic compacted layout data until said calculated electronic area data indicates that the dead space is less than said predetermined area value.

15. The automatic electronic design apparatus of claim 14 wherein said apparatus further includes:

means for altering said electronic circumscribed frame data by expansion;

means for calculating electronic overlap data corresponding to a degree of overlap between said circuit blocks; and means for further altering the electronic circumscribed frame data by expansion when the calculated electronic overlap data indicates that the degree of overlap exceeds a predetermined overlap value, and expanding the electronic compacted layout data until said electronic overlap data indicates that the degree of overlap is less than the predetermined overlap value while continuing a balancing use of the repulsive force of the spring model.

16. The automatic electronic design apparatus of claim 12 wherein said means for generating electronic compacted layout data includes:

means for calculating electronic distance data corresponding to intercentral coordinate distances between each one of said circuit blocks arranged according to said electronic revised layout data and all circuit blocks laid out regularly; and means for selecting electronic select distance data from the electronic distance data corresponding to a select circuit block which has a minimum intercentral distance and for altering the electronic compacted layout data based on a moving of the select circuit block to a corresponding regular position.

17. The automatic electronic design apparatus of claim 12 further comprising means for producing electronic function data corresponding to a function of fixed circuit blocks.

* * * * *